United States Patent
Forbes

(10) Patent No.: US 7,166,886 B2
(45) Date of Patent: Jan. 23, 2007

(54) DRAM CELLS WITH REPRESSED FLOATING GATE MEMORY, LOW TUNNEL BARRIER INTERPOLY INSULATORS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 10/783,695

(22) Filed: Feb. 20, 2004

(65) Prior Publication Data

US 2004/0160830 A1 Aug. 19, 2004

Related U.S. Application Data

(63) Continuation of application No. 09/945,395, filed on Aug. 30, 2001, now Pat. No. 6,754,108.

(51) Int. Cl.
*H01L 29/788* (2006.01)

(52) U.S. Cl. ............... 257/315; 257/298; 257/E29.308; 365/185.08; 438/257

(58) Field of Classification Search ................ 257/314, 257/315, 319, 320, 324, 298, E29.3, E29.308; 365/185.08
See application file for complete search history.

(56) References Cited

U.S. PATENT DOCUMENTS

| | | | |
|---|---|---|---|
| 4,295,150 A | 10/1981 | Adam | 357/54 |
| 4,412,902 A | 11/1983 | Michikami et al. | 204/192 |
| 4,510,584 A * | 4/1985 | Dias et al. | 365/185.08 |
| 4,545,035 A * | 10/1985 | Guterman et al. | 365/185.08 |
| 4,556,975 A | 12/1985 | Smith et al. | |
| 4,665,417 A * | 5/1987 | Lam | 257/298 |
| 4,672,240 A | 6/1987 | Smith et al. | |
| 4,688,078 A | 8/1987 | Hseih | |
| 4,757,360 A | 7/1988 | Faraone et al. | 357/23.5 |
| 4,780,424 A | 10/1988 | Holler | 437/29 |
| 4,939,559 A | 7/1990 | DiMaria et al. | |
| 5,042,011 A | 8/1991 | Casper et al. | 365/205 |
| 5,057,448 A * | 10/1991 | Kuroda | 438/241 |
| 5,071,782 A | 12/1991 | Mori | 437/48 |

(Continued)

OTHER PUBLICATIONS

Eierdal, L., et al., "Interaction of oxygen with Ni(110) studied by scanning tunneling microscopy", *Surface Science*, 312(1-2), (Jun. 1994), 31-53.

(Continued)

*Primary Examiner*—B. William Baumeister
*Assistant Examiner*—Steven J. Fulk
(74) *Attorney, Agent, or Firm*—Schwegman, Lundberg, Woessner & Kluth, P.A.

(57) ABSTRACT

Structures and methods for memory cells having a volatile and a non-volatile component in a single memory cell are provided. The memory cell includes a first source/drain region and a second source/drain region separated by a channel region in a substrate. A storage capacitor is coupled to one of the first and the second source/drain regions. A floating gate opposes the channel region and separated therefrom by a gate oxide. A control gate opposes the floating gate. The control gate is separated from the floating gate by a low tunnel barrier intergate insulator. The memory cell is adapted to operate in a first and a second mode of operation. The first mode of operation is a dynamic mode of operation and the second mode of operation is a repressed memory mode of operation.

109 Claims, 10 Drawing Sheets

U.S. PATENT DOCUMENTS

| | | | |
|---|---|---|---|
| 5,073,519 A | 12/1991 | Rodder | |
| 5,153,880 A | 10/1992 | Owen et al. | |
| 5,280,205 A | 1/1994 | Green et al. | 307/530 |
| 5,331,188 A * | 7/1994 | Acovic et al. | 257/298 |
| 5,350,738 A | 9/1994 | Hase et al. | 505/473 |
| 5,353,431 A | 10/1994 | Doyle et al. | |
| 5,399,516 A | 3/1995 | Bergendahl et al. | 437/43 |
| 5,418,389 A | 5/1995 | Watanabe | 257/295 |
| 5,429,966 A | 7/1995 | Wu et al. | |
| 5,474,947 A | 12/1995 | Chang et al. | |
| 5,488,612 A | 1/1996 | Heybruck | |
| 5,497,494 A | 3/1996 | Combs et al. | 395/750 |
| 5,498,558 A | 3/1996 | Kapoor | 437/43 |
| 5,508,544 A | 4/1996 | Shah | 257/316 |
| 5,600,592 A | 2/1997 | Atsumi et al. | 365/185.18 |
| 5,618,575 A | 4/1997 | Peter | 427/8 |
| 5,618,761 A | 4/1997 | Eguchi et al. | |
| 5,619,051 A | 4/1997 | Endo | |
| 5,619,642 A | 4/1997 | Nielsen et al. | 395/182.04 |
| 5,627,785 A | 5/1997 | Gilliam et al. | 365/189.01 |
| 5,677,867 A | 10/1997 | Hazani | 365/185 |
| 5,691,209 A | 11/1997 | Liberkowski | 437/7 |
| 5,691,230 A | 11/1997 | Forbes | 437/62 |
| 5,739,544 A | 4/1998 | Yuki et al. | 257/25 |
| 5,798,548 A | 8/1998 | Fujiwara | |
| 5,801,401 A | 9/1998 | Forbes | 257/77 |
| 5,852,306 A | 12/1998 | Forbes | 257/315 |
| 5,880,991 A | 3/1999 | Hsu et al. | 365/182 |
| 5,923,056 A | 7/1999 | Lee et al. | 257/192 |
| 5,936,274 A | 8/1999 | Forbes et al. | 257/315 |
| 5,952,692 A | 9/1999 | Nakazato et al. | 257/321 |
| 5,959,465 A | 9/1999 | Beat | |
| 5,973,355 A | 10/1999 | Shirai et al. | |
| 5,981,350 A | 11/1999 | Geusic et al. | 438/386 |
| 5,986,932 A | 11/1999 | Ratnakumar et al. | 365/185.07 |
| 5,991,225 A | 11/1999 | Forbes et al. | 365/230.06 |
| 6,009,011 A | 12/1999 | Yamauchi | |
| 6,025,228 A | 2/2000 | Ibok et al. | 438/261 |
| 6,025,627 A | 2/2000 | Forbes et al. | 257/321 |
| 6,031,263 A | 2/2000 | Forbes et al. | 257/315 |
| 6,069,380 A | 5/2000 | Chou et al. | |
| 6,069,816 A | 5/2000 | Nishimura | 365/145 |
| 6,077,745 A | 6/2000 | Burns, Jr. et al. | 438/270 |
| 6,108,240 A | 8/2000 | Lavi et al. | |
| 6,124,729 A | 9/2000 | Noble et al. | 326/41 |
| 6,134,175 A | 10/2000 | Forbes et al. | 365/230.06 |
| 6,135,175 A | 10/2000 | Gaudreault et al. | 144/4.1 |
| 6,141,238 A | 10/2000 | Forbes et al. | 365/145 |
| 6,141,248 A | 10/2000 | Forbes et al. | 365/185.08 |
| 6,143,636 A | 11/2000 | Forbes et al. | 438/587 |
| 6,153,468 A | 11/2000 | Forbes et al. | 438/257 |
| 6,163,049 A | 12/2000 | Bui | 257/321 |
| 6,169,306 B1 | 1/2001 | Gardner et al. | |
| 6,208,164 B1 | 3/2001 | Noble et al. | 326/41 |
| 6,210,999 B1 | 4/2001 | Gardner et al. | 438/183 |
| 6,229,175 B1 | 5/2001 | Uchida | 257/315 |
| 6,238,976 B1 | 5/2001 | Noble et al. | |
| 6,246,606 B1 | 6/2001 | Forbes et al. | 365/185.03 |
| 6,249,020 B1 | 6/2001 | Forbes et al. | 257/315 |
| 6,249,460 B1 | 6/2001 | Forbes et al. | |
| 6,306,708 B1 | 10/2001 | Peng | 438/266 |
| 6,307,775 B1 | 10/2001 | Forbes et al. | 365/185.01 |
| 6,317,364 B1 | 11/2001 | Guterman et al. | |
| 6,323,844 B1 | 11/2001 | Yeh et al. | 345/166 |
| 6,341,084 B2 | 1/2002 | Numata et al. | |
| 6,351,411 B2 | 2/2002 | Forbes et al. | 365/182 |
| 6,377,070 B1 | 4/2002 | Forbes | |
| 6,424,001 B1 | 7/2002 | Forbes et al. | 257/315 |
| 6,433,382 B1 | 8/2002 | Orlowski et al. | 257/315 |
| 6,440,801 B1 | 8/2002 | Furukawa et al. | |
| 6,461,931 B1 | 10/2002 | Eldridge | 438/398 |
| 6,475,857 B1 | 11/2002 | Kim et al. | 438/240 |
| 6,476,434 B1 | 11/2002 | Noble et al. | |
| 6,504,207 B1 | 1/2003 | Chen et al. | |
| 6,514,842 B1 | 2/2003 | Prall et al. | |
| 6,521,943 B1 | 2/2003 | Mine et al. | |
| 6,541,280 B2 | 4/2003 | Kaushik et al. | 438/3 |
| 6,566,682 B2 | 5/2003 | Forbes | |
| 6,574,143 B2 | 6/2003 | Nakazato | |
| 6,586,797 B2 | 7/2003 | Forbes et al. | 257/325 |
| 6,730,575 B2 | 5/2004 | Eldridge | |
| 6,740,928 B2 * | 5/2004 | Yoshii et al. | 257/315 |
| 6,753,568 B1 | 6/2004 | Nakazato et al. | |
| 6,754,108 B2 | 6/2004 | Forbes | |
| 6,778,441 B2 | 8/2004 | Forbes et al. | |
| 6,881,994 B2 | 4/2005 | Lee et al. | |
| 6,894,944 B2 | 5/2005 | Ishibashi et al. | |
| 6,903,367 B2 | 6/2005 | Forbes | |
| 6,950,340 B2 | 9/2005 | Bhattacharyya | |
| 6,952,032 B2 | 10/2005 | Forbes et al. | |
| 6,958,937 B2 | 10/2005 | Forbes et al. | |
| 6,963,103 B2 | 11/2005 | Forbes | |
| 7,027,328 B2 | 4/2006 | Forbes et al. | |
| 7,042,043 B2 | 5/2006 | Forbes et al. | |
| 7,068,544 B2 | 6/2006 | Forbes et al. | |
| 7,074,673 B2 | 7/2006 | Forbes | |
| 7,075,829 B2 | 7/2006 | Forbes | |
| 7,087,954 B2 | 8/2006 | Forbes | |
| 2001/0013621 A1 | 8/2001 | Nakazato | 257/314 |
| 2001/0041250 A1 | 11/2001 | Werkhoven et al. | |
| 2001/0055838 A1 | 12/2001 | Walker et al. | 438/129 |
| 2002/0008324 A1 | 1/2002 | Shinkawata | |
| 2002/0024083 A1 * | 2/2002 | Noble et al. | 257/306 |
| 2002/0028541 A1 | 3/2002 | Lee et al. | 438/149 |
| 2002/0106536 A1 | 8/2002 | Lee et al. | 428/702 |
| 2002/0109138 A1 | 8/2002 | Forbes | |
| 2002/0137250 A1 | 9/2002 | Nguyen et al. | 438/53 |
| 2002/0176293 A1 | 11/2002 | Forbes et al. | |
| 2003/0042528 A1 | 3/2003 | Forbes | |
| 2003/0043637 A1 | 3/2003 | Forbes et al. | |
| 2004/0032773 A1 | 2/2004 | Forbes | |
| 2004/0160830 A1 | 8/2004 | Forbes | |
| 2005/0023595 A1 | 2/2005 | Forbes et al. | |
| 2005/0023602 A1 | 2/2005 | Forbes et al. | |
| 2005/0023603 A1 * | 2/2005 | Eldridge et al. | 257/315 |
| 2005/0024945 A1 | 2/2005 | Forbes | |
| 2005/0026349 A1 | 2/2005 | Forbes et al. | |
| 2005/0169054 A1 | 8/2005 | Forbes | |
| 2006/0001049 A1 | 1/2006 | Forbes | |
| 2006/0002192 A1 | 1/2006 | Forbes et al | |

OTHER PUBLICATIONS

Marshalek, R., et al., "Photoresponse Characteristics of Thin-Film Nickel—Nickel Oxide—Nickel Tunneling Junctions", *IEEE Journal of Quantum Electronics, QE-19*(4), (1983), 743-754.

Aarik, Jaan, et al., "Anomalous effect of temperature on atomic layer deposition of titanium oxide", *Journal of Crystal Growth*, (2000),pp. 531-537.

Aarik, Jaan, et al., "Texture development in nanocrystalline hafnium dioxide thin films grown by atomic layer deposition", *Journal of Crystal Growth*, 220(1-2), (2000), 105-113.

Afanes'ev, V, et al., "Electron energy barriers between (100)Si and ultrathin stacks of SiO2, Al2O3, and ZrO3 and ZrO2 insulators", *Applied Physics Letters*, 78(20), (2001),pp. 3073-3075.

Arya, S., et al., "Conduction Properties of Thin Al2O3 Films", *Thin Solid Films*, 91, (1982),363-374.

Dipert, Brian, "Flash Memory Goes Mainstream", *IEEE Spectrum*, 30(10), (Oct. 1993),48-52.

Eldridge, J., et al., "Analysis of Ultrathin Oxide Growth on Indium", *Thin Solid Films*, 12, (1972),pp. 447-451.

Eldridge, J. M., et al., "Growth of Thin PbO Layers on Lead Films", *Surface Science*, 40, (1973),512-530.

Eldridge, J., et al., "Measurement of Tunnel Current Density in a Metal-Oxide-Metal System as a Function of Oxide Thickness", *Proc. 12th Intern. Conf. on Low Temperature Physics*, (1971),427-428.

Ferguson, J D., et al., "Atomic layer deposition of Al2O3 and SiO2 on BN particles using sequential surface reaction", *Applied Surface Science*, (2000),pp. 280-292.

Greiner, J., "Josephson Tunneling Barriers by rf Sputter Etching in an Oxygen Plasma", *Journal of Applied Physics*, 42(12), (Nov. 1971),5151-5155.

Greiner, J., "Oxidation of lead films by rf sputter etching in an oxygen plasma", *Journal of Applied Physics*, 45(1), (1974),32-37.

Grimblot, J., et al., "I. Interaction of Al films with O2 at low pressure", *J. Electro. Chem. Soc.*, vol. 129, No. 10,(1982),pp. 2366-2368.

Grimblot, J., et al., "II. Oxidation of Aluminum Films", *J. Electrochem.*, 129, (1982),pp. 2369-2372.

Gundlach, K., et al., "Logarithmic Conductivity of Al-Al2O3-Al Tunneling Junctions Produced by Plasma and by Thermal Oxidation", *Surface Science*, 27, (1971),125-141.

Guo, X., "High Quality Ultra-thin (1.5 nm) TiO2/Si3N4 Gate Dielectric for Deep Sub-micron CMOS Technology", *IEDM Technical Digest*, (1999),pp. 137-140.

Hodges, D. A., *Analysis and Design of Digital Integrated Circuits*, 2nd Edition, McGraw-Hill Publishing. New York,(1988),354-357.

Hodges, D. A., *Analysis and Design of Digital Integrated Circuits*, McGraw-Hill Book Company, 2nd Edition,(1988),394-396.

Hurych, Z., "Influence of Non-Uniform Thickness of Dielectric Layers on Capacitance and Tunnel Currents", *Solid-State Electronics*, vol. 9, (1966), pp. 967-979.

Itokawa, H, "Determination of Bandgap and Energy Band Alignment for High-Dielectric-Constant Gate Insulators Using High-Resolution X-ray Photoelectron Spectroscopy", *Extended Abstracts of the 1999 International Conference on Solid State Devices and Materials*, (1999), pp. 158-159.

Kim, Yong S., et al., "Effect of rapid thermal annealing on the structure and the electrical properties of atomic-layer-deposited Ta2O5 films", *Journal of the Korean Physical Society*, (Dec. 2000), pp. 975-979.

Kim, H., "Leakage current and electrical breakdown in metal-organic chemical vapor deposited TiO2 dielectrics on silicon substrates", *Applied Phys. Lett.*, 69(25), (1996),pp. 3860-3862.

Kim, Yeong K., et al., "Novel capacitor technology for high density stand-alone and embedded DRAMs", *IEDM*, (2000), pp. 369-372.

Kubaschewski, O., et al., *Oxidation of Metals and Alloys, Second Edition*, Butterworths, London,(1962), pp. 1-3, 5,6, 8-12, 24, 36-39.

Kubaschewski, O., et al., "Oxidation of Metals and Alloys", *Butterworths*, London, (1962), pp. 53-63.

Kukli, Kaupo, "Atomic Layer Deposition of Titanium Oxide from TiI4 and H2O2", *Chemical Vapor Deposition*, 6(6), (2000), pp. 303-310.

Kukli, Kaupo, et al., "Atomic layer deposition of zirconium oxide from zirconium tetraiodide, water and hydrogen peroxide", *Journal of Crystal Growth*, (2001), pp. 262-272.

Kukli, K., "Development of Dielectric Properties of Niobium Oxide, Tantalum Oxide, and Aluminum Oxide Based Nanolayered Materials", *Journal of the Electrochemical Society*, 148(2), (2001), pp. F35-F41.

Kukli, Kaupo, et al., "Real-time monitoring in atomic layer deposition of TiO2 from TiI4and H2O-H2O2", Languir (*American Chemical Society*), (2000), pp. 8122-8128.

Kwo, J., "Properties of high k gate dielectrics Gd2O3 and Y2O3 for Si", *Journal of Applied Physics*, 89(7), (2001), pp. 3920-3927.

Lee, J. et al., "Effect of Polysilicon Gate on the Flatband Voltage Shift and Mobility Degradation for ALD-Al2O3 Gate Dielectric", *IEDM*, (2000), pp. 645-648.

Luan, H. F., "High Quality Ta2O5 Gate Dielectrics with Tox,eq<10A", *IEDM Technical Digest, International Electron Devices Meeting*, (Dec. 5-8, 1999), pp. 141-143.

Ma, Y. et al., "Zirconium Oxide Based Gate Dielectrics with equivalents Oxide Thickness of LEss Than 1.0 nm and Performance of Submicron MOSFET using a Nitride Gate Replacement Process", *IEDM—Technical Digest*, (1999), pp. 149-152.

Masuoka, F., et al., "A 256K Flash EEPROM using Triple Polysilicon Technology", *IEEE International Solid-State Circuits Conference, Digest of Technical Papers*, (1985), pp. 168-169.

Masuoka, F., et al., "A New Flash EEPROM Cell using Triple Polysilicon Technology", *International Electron Devices Meeting, Technical Digest*, San Francisco, CA,(1984), pp. 464-467.

Mori, S., et al., "Reliable CVD Inter-Poly Dielectrics for Advanced E&EEPROM", *Symposium on VSLI Technology, Digest of Technical Papers*, (1985), pp. 16-17.

Muller, H., "Electrical and Optical Properties of Sputtered In2O3 Films", *Physica Status Solidi*, 27(2), (1968), pp. 723-731.

Paranjpe, Ajit, et al., "Atomic layer deposition of AlOx for thin film head gap applications", *Journal of the Electrochemical Society*, (Sep. 2001), pp. 465-471.

Pashley, R., et al., "Flash Memories: the best of two worlds", *IEEE Spectrum*, 26(12), (Dec. 1989), pp. 30-33.

Pollack, S., et al., "Tunneling Through Gaseous Oxidized Films of Al2O3", *Transactions of the Metallurgical Society of AIME*, 233, (1965), pp. 497-501.

Qi, W, "MOSCAP and MOSFET characteristics using ZrO2 gate dielectric deposited directly on Si", *IEDM—Technical Digest*, (1999), pp. 145-148.

Robertson, J., "Band offsets of wide-band-gap oxides and implications for future electronic devices", *Journal of Vacuum Science & Technology B (Microelectronics and Nanometer Structures)*, 18(3), (May-Jun. 2000), pp. 1785-1791.

Robertson, J., et al., "Schottky Barrier height of Tantalum oxide, barium strontium titanate, lead titanate, and strontium bismuth tantalate", *Applied Physics Letters*, vol. 74, No. 8, (Feb. 22, 1999),pp. 1168-1170.

Shi, Y., "Tunneling Leakage Current in Ultrathin (<4 nm) Nitride/Oxide Stack Dielectrics", *IEEE Electron Device Letters*, 19(10), (1998), pp. 388-390.

Simmons, J., "Generalized Formula for the Electric Tunnel Effect between Similar Electrodes Separated by a Thin Insulating Film", *Journal of Applied Physics*, 34(6), (1963), pp. 1793-1803.

Smith, Ryan C., et al., "Chemical vapour deposition of the oxides of titanium, zirconium and hafnium for use as high-k materials in microelectronic devices. A carbon-free precursor for the synthesis if hafnium dioxide", *Advanced Materials for Optics and Electronics*, (2000), pp. 105-106.

Swalin, R., "Equilibrium between Phases of Variable Composition", *Thermodynamics of Solids, 2nd Edition*, (1972),pp. 165-180.

Sze, S., "Physics of Semiconductor Devices, Second Edition", *John Wiley & Sons*, New York, (1981), pp. 553-556.

Yan, J., et al., "Structural and electrical characterization of TiO2 grown from titanium tetrakis-isopropoxide (TTIP) and TTIP/H2O ambients", *Journal Vac. Sci. Technol. B*, 14(3), (1996), pp. 1706-1711.

Zhang, H., et al., "Atomic Layer Deposition of High Dielectric Constant Nanolaminates", *Journal of The Electrochemical Society*, 148(4),(2001),F63-F66.

\* cited by examiner

DRAM CELLS WITH REPRESSED FLOATING GATE MEMORY, LOW TUNNEL BARRIER INTERPOLY INSULATORS

RELATED APPLICATIONS

This application is a continuation of U.S. application Ser. No. 09/945,395 filed on 30 Aug. 2001, now U.S. Pat. No. 6,754,108 which is incorporated herein by reference.

CROSS REFERENCE TO RELATED APPLICATIONS

This application is related to the following co-pending, commonly assigned U.S. patent applications: "Programmable Array Logic or Memory Devices with Asymmetrical Tunnel Barriers," Ser. No. 09/943,134, "Integrated Circuit Memory Device and Method," Ser. No. 09/945,498, "In Service Programmable Logic Arrays with Low Tunnel Barrier Interpoly Insulators," Ser. No. 09/945,512, "Flash Memory with Low Tunnel Barrier Interpoly Insulators," Ser. No. 09/945,507, "Programmable Memory Address and Decode Circuits with Low Tunnel Barrier Interpoly Insulators," Ser. No. 09/945,500, and "SRAM Cells with Repressed Floating Gate Memory, Low Tunnel Barrier Interpoly Insulators," Ser. No. 09/945,554, which are filed on even date herewith and each of which disclosure is herein incorporated by reference.

FIELD OF THE INVENTION

The present invention relates generally to integrated circuits, and in particular to DRAM cells with repressed floating gate memory, metal oxide tunnel interpoly insulators.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 140 and an access field effect transistor or transfer device 120. For each cell, one side of the storage capacitor 140 is connected to a reference voltage (illustrated as a ground potential for convenience purposes). The other side of the storage capacitor 140 is connected to the drain of the transfer device 120. The gate of the transfer device 120 is connected to a signal known in the art as a word line 180. The source of the transfer device 120 is connected to a signal known in the art as a bit line 160 (also known in the art as a digit line). With the memory cell 100 components connected in this manner, it is apparent that the word line 180 controls access to the storage capacitor 140 by allowing or preventing the signal (representing a logic "0" or a logic "1") carried on the bit line 160 to be written to or read from the storage capacitor 140. Thus, each cell 100 contains one bit of data (i.e., a logic "0" or logic "1").

In FIG. 2 a DRAM circuit 240 is illustrated. The DRAM 240 contains a memory array 242, row and column decoders 244, 248 and a sense amplifier circuit 246. The memory array 242 consists of a plurality of memory cells 200 (constructed as illustrated in FIG. 1) whose word lines 280 and bit lines 260 are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the DRAM 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the storage capacitor of the memory cell to its bit line 260 by measuring the potential difference between the activated bit line 260 and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

DRAM devices are the most cost effective high speed memory used with computers and computer systems. They last (nearly) indefinitely and are available in very high density. They are, however, limited in the longevity of their memory. DRAM devices require constant refreshing and lose all knowledge of their state (i.e., contents) once power to the device is removed. It is desirable to have a memory device, such as a DRAM memory device, with all of the positive features of DRAM devices, e.g., cost, size, speed, availability, etc., that retains its memory state when power is removed from the device.

A DRAM cell with a nonvolatile component would be very beneficial in numerous computer systems and computer applications. One application would be the saving and/or restoring of the state of a central processing unit (CPU) that is executing software instructions in a protected mode of operation, an example of which is disclosed in U.S. Pat. No. 5,497,494 to Combs et al., which is hereby incorporated by reference in its entirety. This application typically involves the use of memory separate from the main memory of the computer, typically referred to as shadow RAM, from which a BIOS program is executed and the CPU state is to be stored to and retrieved from. This, however, consumes valuable chip real estate.

This holds true for other computer systems that utilize shadow memory, such as, for example, the fault tolerant system disclosed in U.S. Pat. No. 5,619,642 to Nielson et al., which is hereby incorporated by reference in its entirety. In a fault tolerant system, a main memory contains data and error detection codes associated with each piece of data. A separate shadow memory is used to store data corresponding to the data stored in the main memory. If the system determines that accessed data from the main memory is erroneous, the corresponding data from the shadow memory is used and thus, faults in the main memory do not adversely effect the system (i.e., the system is fault tolerant). Again, memory separate from the main memory is required, which adds cost and adds to the size and complexity of the system.

There have been attempts to include shadow memory on DRAM and SRAM devices, such as the memory disclosed in U.S. Pat. No. 5,399,516 to Bergendahl et al. and U.S. Pat. No. 5,880,991 to Hsu et al. These devices, however, place individual DRAM and/or SRAM cells on the same substrate as separate nonvolatile memory cells. They do not use a single DRAM (or SRAM) cell having its own integral nonvolatile component. Instead, separate cells are used, which adds cost, size and complexity to the memory. There are many other uses which require such a separate non-volatile memory component such as the shadow memory described above.

One type of non-volatile memory includes Flash memory. Flash memories are another form of non-volatile memory. Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interpoly dielectric insulator for erase. Various combinations of silicon oxide and silicon nitride were tried. However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAlN, which exhibit a lower work function, the use of structured surfaces which increase the localized electric fields, and amorphous SiC gate insulators with larger electron affinity, X, to increase the tunneling probability and reduce erase time.

However, all of these approaches relate to increasing tunneling between the floating gate and the substrate such as is employed in a conventional ETOX device and do not involve tunneling between the control gate and floating gate through and inter-poly dielectric.

Therefore, there is a need in the art to provide improved memory densities having both a volatile and non-volatile components. Any such memory cells should avoid the added cost, size and complexity of having separate volatile and nonvolatile memory cell components. The non-volatile memory component should avoid the large barriers to electron tunneling or hot electron injection presented by the silicon oxide-silicon interface, 3.2 eV, which result in slow write and erase speeds even at very high electric fields. There is also a need, within the non-volatile component, to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach for the non-volatile component, the above mentioned problems of having a rough top surface on the polysilicon floating gate which results in, poor quality interpoly oxides, sharp points, localized high electric fields, premature breakdown and reliability problems must be avoided.

REFERENCES

1. F. Masuoka et al., "A New Flash EEPROM Cell Using Triple Polysilicon Technology," IEEE Int. Electron Devices Meeting, San Francisco, pp. 464–67, 1984.
2. F. Masuoka et al., "256K Flash EEPROM Using Triple Polysilicon Technology," IEEE Solid-State Circuits Conf., Philadelphia, pp. 168–169, 1985.
3. S. Mori et al., "Reliable CVD Inter-poly Dielectics for Advanced E&EEPROM," Symp. On VLSI Technology, Kobe, Japan, pp. 16–17, 1985.
4. U.S. Pat. No. 4,780,424, "Process for Fabricating Electrically Alterable Floating Gate Memory Devices," 25 Oct. 1988.
5. B. Dipert and L. Hebert, "Flash Memory Goes Mainstream," IEEE Spectrum, pp. 48–51, October, 1993.
6. R. D. Pashley and S. K. Lai, "Flash Memories, The Best of Two Worlds," IEEE Spectrum, pp. 30–33, December 1989.
7. S. R. Pollack and C. E. Morris, "Tunneling Through Gaseous Oxidized Films of $Al_2O_3$," Trans. AIME, Vol. 233, p. 497, 1965.
8. T. P. Ma et al., "Tunneling Leakage Current in Ultrathin (<4 nm) Nitride/Oxide Stack Dielectrics," IEEE Electron Device Letters, vol. 19, no. 10, pp. 388–390, 1998.
9. O. Kubaschewski and B. E. Hopkins, "Oxidation of Metals and Alloys", Butterworth, London, pp. 53–64, 1962.
10. J. M. Eldridge and J. Matisoo, "Measurement of Tunnel Current Density in a Meal-Oxide-Metal System as a Function of Oxide Thickness," Proc. $12^{th}$ Intern. Conf. on Low Temperature Physics, pp. 427–428, 1971.
11. J. M. Eldridge and D. W. Dong, "Growth of Thin PbO Layers on Lead Films. I. Experiment," Surface Science, Vol. 40, pp. 512–530, 1973.
12. J. H. Greiner, "Oxidation of Lead Films by RF Sputter Etching in an Oxygen Plasma", J. Appl. Phys., Vol. 45, No. 1, pp. 32–37, 1974.
13. S. M. Sze, Physics of Semiconductor Devices, Wiley, N.Y., pp.553–556, 1981.
14. G. Simmons and A. El-Badry, "Generalized Formula for the Electric Tunnel Effect Between Similar Electrodes Separated by a Thin Insulating Film," J. Appl. Phys., Vol. 34, p. 1793, 1963.
15. Z. Hurych, "Influence of Nonuniform Thickness of Dielectric Layers on Capacitance and Tunnel Currents," Solid-State Electronics, Vol. 9, p. 967, 1966.

16. S. P. S. Arya and H. P. Singh, "Conduction Properties of Thin $Al_2O_3$ Films," Thin Solid Films, Vol. 91, No. 4, pp. 363–374, May 1982.
17. K. H. Gundlach and J. Holzl, "Logarithmic Conductivity of Al—$Al_2O_3$—Al Tunneling Junctions Produced by Plasma- and by Thermal-Oxidation", surface Science, Vol. 27, pp. 125–141, 1971.
18. J. Grimblot and J. M. Eldridge, "I. Interaction of Al Films with $O_2$ at Low Pressures," J. Electro. Chem. Soc., Vol. 129, No. 10, pp. 2366–2368, 1982.
19. J. Grimblot and J. M. Eldridge, "II. Oxidation of Al Films," J. Electro. Chem. Soc., Vol. 129, No. 10, pp. 2369–2372, 1982.
20. J. H. Greiner, "Josephson Tunneling Barriers by RF Sputter Etching in an Oxygen Plasma," J. Appl. Phys., Vol. 42, No. 12, pp. 5151–5155, 1971.
21. O. Michikami et al., "Method of Fabrication of Josephson Tunnel Junctions," U.S. Pat. No. 4,412,902, Nov. 1, 1983.
22. H. F. Luan et al., "High Quality $Ta_2O_5$ Gate Dielectrics with $T_{ox,eq}$<10 Angstroms," IEDM Tech. Digest, pp. 141–144, 1999.
23. Hase et al., "Method of Manufacturing an Oxide Superconducting Film," U.S. Pat. No. 5,350,738, Sep. 27, 1994.

SUMMARY OF THE INVENTION

The above mentioned problems with conventional memories and other problems are addressed by the present invention and will be understood by reading and studying the following specification. Systems and methods are provided for high density memories having both a volatile and nonvolatile component. The nonvolatile component includes a floating gate separated from a control gate by a metal oxide and/or low tunnel barrier interpoly insulator.

In one embodiment of the present invention, memory cells having a volatile and a non-volatile component in a single cell are provided. The memory cell includes a first source/drain region and a second source/drain region separated by a channel region in a substrate. A storage capacitor is coupled to one of the first and the second source/drain regions. A floating gate opposes the channel region and separated therefrom by a gate oxide. A control gate opposes the floating gate. The control gate is separated from the floating gate by a low tunnel barrier intergate insulator. The memory cell is adapted to operate in a first and a second mode of operation. The first mode of operation is a dynamic mode of operation and the second mode of operation is a repressed memory mode of operation.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 3A:
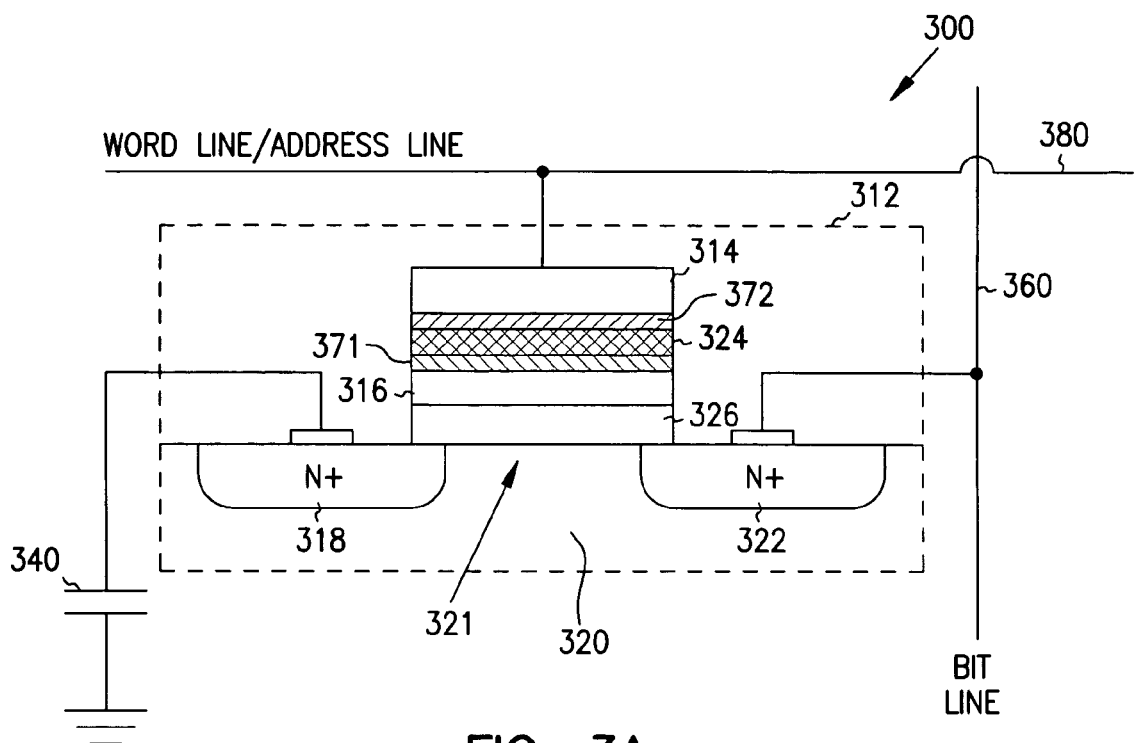
FIGS. 3A and 3B are circuit diagrams illustrating DRAM cells constructed in accordance with different embodiments of the present invention.

The present invention, describes the use of a memory cell having a volatile and a non-volatile memory component. The non-volatile memory component includes a metal oxide inter-poly dielectric insulators between the control gate and the floating gate. An example is shown in FIG. 3A for a planar structure, or horizontal memory cell. According to the teachings of the present invention. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 3A illustrates one embodiment of a memory cell 300, according to the teachings of the present invention. As shown in FIG. 3A, the memory cell 300 includes a first source/drain region 318 and a second source/drain region 322 separated by a channel region 321 in a substrate 320. A floating gate 316 opposes the channel region 321 and is separated therefrom by a gate oxide 326. A control gate 314 opposes the floating gate 316. According to the teachings of the present invention, the control gate 314 is separated from the floating gate 316 by a low tunnel barrier intergate insulator 324.

In one embodiment of the present invention, low tunnel barrier intergate insulator 324 includes a metal oxide insulator selected from the group consisting of lead oxide (PbO) and aluminum oxide ($Al_2O_3$). In an alternative embodiment of the present invention, the low tunnel barrier intergate insulator 324 includes a transition metal oxide and the transition metal oxide is selected from the group consisting of $Ta_2O_5$, $TiO_2$, $ZrO_2$, and $Nb_2O_5$. In still another alternative embodiment of the present invention, the low tunnel barrier intergate insulator 324 includes a Perovskite oxide tunnel barrier.

According to the teachings of the present invention, the floating gate 316 includes a polysilicon floating gate 316 having a metal layer 371 formed thereon in contact with the low tunnel barrier intergate insulator 324. Likewise, the control gate 314 includes a polysilicon control gate 314 having a metal layer 372 formed thereon in contact with the low tunnel barrier intergate insulator 324. In this invention, the metal layers, 371 and 372, are formed of the same metal material used to form the metal oxide interpoly insulator 324.

Figure 3B:
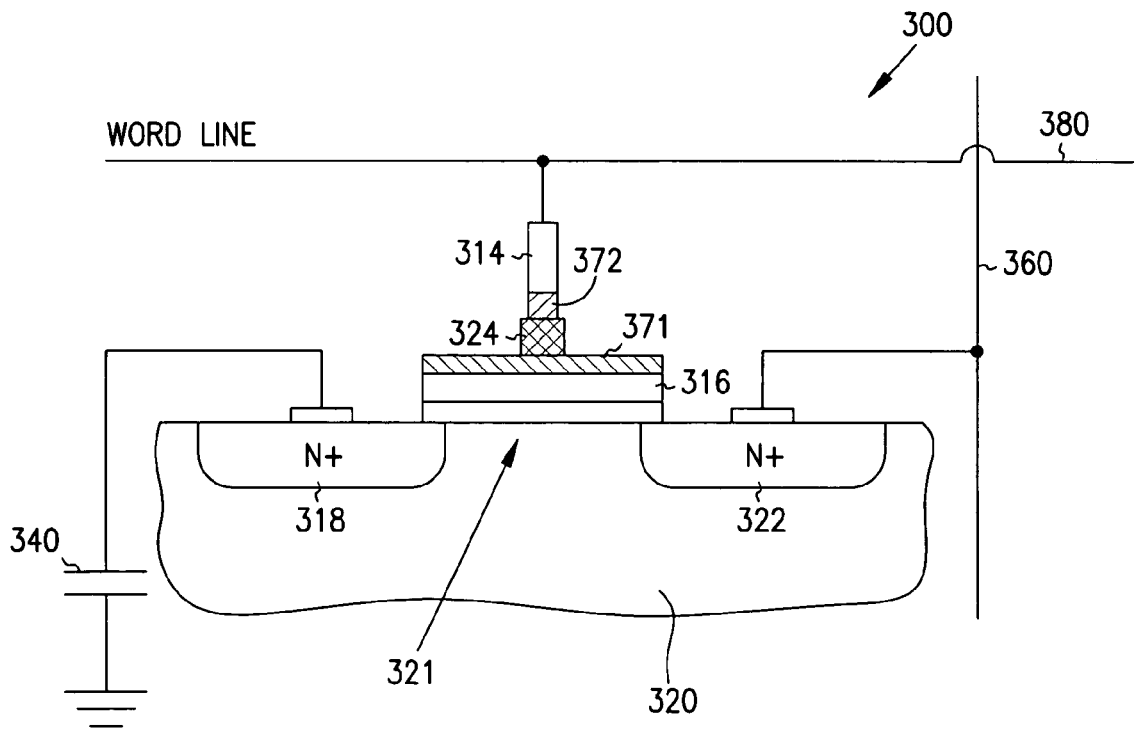

FIG. 3B illustrates another embodiment of a memory cell 300, according to the teachings of the present invention. As shown in the embodiment of FIG. 3B, a first source/drain region 318 and a second source/drain region 322 are separated by a channel region 321 in a substrate. A storage capacitor 340 is coupled to one of the first and the second source/drain regions, 318 and 322. A floating gate 316 opposes the channel region 321 and is separated therefrom by a gate oxide 321. In this embodiment, a vertical, edge defined control gate 314 opposes the floating gate 316, wherein the vertical control gate 314 is separated from the floating gate 316 by a low tunnel barrier intergate insulator 324. Methods for forming such an edge defined vertical control gate structure is disclosed in U.S. Pat. No. 6,141,238, which is incorporated herein by reference.

As will be explained in more detail below, in both the embodiments of FIG. 3A and 3B the memory cell 300 is controllable to access a first charge representing a data value from the storage capacitor 340 in a first mode of operation and a second charge representing a data value from the floating gate 316 in a second mode of operation. According to the teachings of the present invention, the first charge is accessible without affecting the second charge and the second charge is accessible without affecting the first charge.

As with the embodiment of FIG. 3A, the low tunnel barrier intergate insulator 324 includes a metal oxide insulator 324 selected from the group consisting of PbO, $Al_2O_3$, $Ta_2O_5$, $TiO_2$, $ZrO_2$, $Nb_2O_5$. In still another alternative embodiment of the present invention, the low tunnel barrier intergate insulator 324 includes a Perovskite oxide tunnel barrier.

As with the embodiment of FIG. 3A, the floating gate 316 includes a polysilicon floating gate 316 having a metal layer 371 formed thereon in contact with the low tunnel barrier intergate insulator 324. Likewise, the vertical, edge defined control gate 314 includes a vertical, edge defined polysilicon control gate 314 having a metal layer 372 formed thereon in contact with the low tunnel barrier intergate insulator 324.

FIGS. 3A and 3B are circuit diagrams illustrating DRAM cells 300 constructed in accordance with an embodiment of the present invention. The cells 300 are similar to the cells 100 illustrated in FIG. 1 with the exception that a different transfer device 312 replaces the transfer device 112 shown in FIG. 1. The transfer device 312 is a transistor having a control gate 314 and an additional gate 316, often referred to as a floating gate, and is of the kind often used in flash memory devices. The transfer device 312 has a drain 318 connected to one end of the storage capacitor 340 and a source 322 connected to the bit line 360 (as in the conventional DRAM cell 100 illustrated in FIG. 1). In one embodiment, the source 322 and drain 318 are constructed from a N+ type region of high impurity concentration formed on a P-type semiconductor substrate 320 and are separated by a channel region 321. The memory cell of the present invention includes both a volatile and non-volatile memory component. According to the teachings of the present invention, the non-volatile component includes a floating gate 316 which is isolated from the control gate 314 by a low tunnel barrier intergate insulator 324 and from the source 322, drain 318 and channel 321 by a gate oxide 326.

In one embodiment of the present invention, as describe above, the low tunnel barrier intergate insulator 324 includes an intergate insulator 324 selected from the group consisting of PbO, $Al_2O_3$, $Ta_2O_5$, $TiO_2$, $ZrO_2$, $Nb_2O_5$. In still another alternative embodiment of the present invention, the low tunnel barrier intergate insulator 324 includes a Perovskite oxide tunnel barrier. In one embodiment, the floating gate 316 includes a polysilicon floating gate 316 having a metal layer 371 formed thereon in contact with the low tunnel barrier intergate insulator 324. And, the control gate 314 includes a polysilicon control gate 314 having a metal layer 372 formed thereon in contact with the low tunnel barrier intergate insulator 324. As will be described below, the use of the transfer device 312 allows the cell 300 of the present invention to be operated as either a conventional DRAM cell or as a nonvolatile memory cell (herein referred to as a DRAM with "repressed memory").

Figure 1:
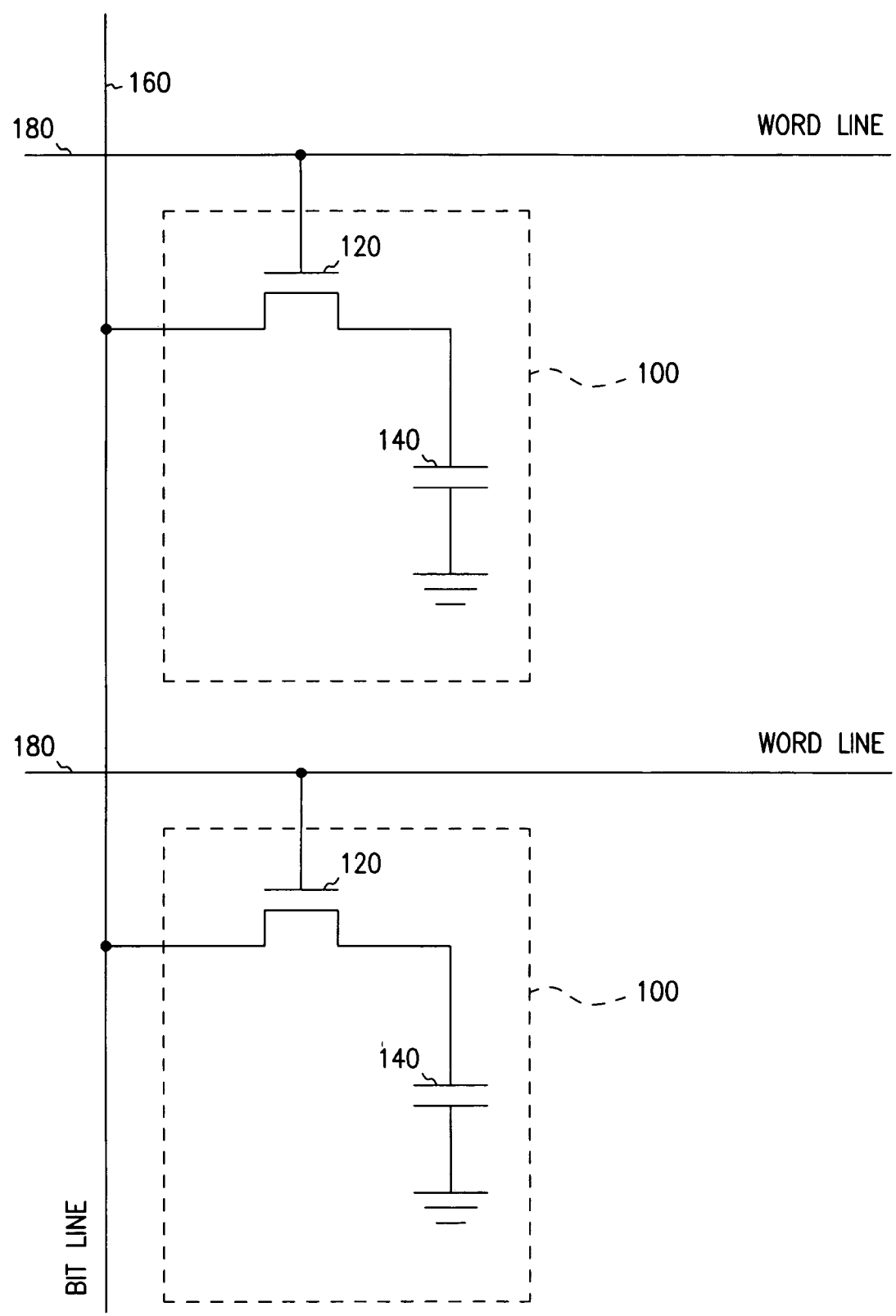
FIG. 1 is a circuit diagram illustrating conventional dynamic random access memory (DRAM) cells.

To write information into the DRAM portion (i.e., the storage capacitor 340) of the cell 300, all that is required is to place a large positive voltage onto the control gate 314 via the word line 380 and the data from the bit line 360 will be transferred to the capacitor 340. This is similar to the way the conventional DRAM cell 100 of FIG. 1 is written to. As will be described below, however, the floating gate 316 may contain a charge on it. This charge may slightly alter the characteristics (e.g., resistance) of the transfer device 312. For example, the transfer of information to/from the bit line 360 may be slower in the cell 300 of the present invention when compared to a similar transfer in the conventional DRAM cell 100 illustrated in FIG. 1. This is a minor trade off considering that a DRAM cell is being provided with a nonvolatile portion without expensive and complex additional circuitry. Thus, when accessing the cell 300 as a DRAM, a voltage that appreciably exceeds the normal threshold voltage of the device 312 should be used to avoid any adverse effects attributable to a charge on the floating gate 316.

To write information into the nonvolatile portion, e.g. the floating gate 316 of the cell 300, a tunnel-tunnel mode of operation will be used to program one of two different charge states onto the floating gate 316 and thus, program the transfer device 312 into one of two states. In one embodiment, a tunnel mode is used to transfer electrons from the source 322 to the floating gate 316 to program the transfer device 312, e.g. the floating gate 316 and thus the nonvolatile portion of the cell 300, to a first charge state. This first charge state is referred to herein as the tunnel write operation. That is, write can be achieved by the normal channel hot electron injection and gate current through the gate silicon oxide 326 to the floating gate 316. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates 314, electrons will tunnel from the control gate 314 to the floating gate 316. The low tunnel barrier 324 will provide an easy write operation and the selection of the substrate or well bias will provide selectivity and address only one device. It should be noted that a negative charge on the floating gate 316, referred to herein as the "first charge state," can be associated with either a logic "0" or "1" and that the invention is not limited to any particular association between the first charge state and a particular logic value. The one requirement is that the program, erase and sensing circuitry used to access the nonvolatile portion of the cell 300 associate the first charge state to the same logic value.

Likewise, a tunnel mode is used to transfer the electrons from the floating gate 316 to the control gate 314 to program the transfer device 312, e.g. the floating gate 316 and thus the nonvolatile portion of the cell 300, to a second charge state. The second charge state is referred to herein as the tunnel erase operation. According to the teachings of the present invention, the tunnel erase operation is achieved by driving the floating gate 316, through the control gate 314 and word line 380, with a large positive voltage. That is, according to the teachings of the present invention, erase is achieved by providing a negative voltage to the substrate or well address line and a large positive voltage to the control gate 314. This causes electrons to tunnel off of the floating gate 316 on to the control gate 314. A whole row can be erased by addressing all the column lines along that row and a block can be erased by addressing multiple row back gate or substrate/well address lines.

To read the non-volatile memory function a column line is addressed by applying a positive control gate voltage and the current sensed along the data bit or drain row address line. Different currents will result in different read times.

It should be noted that the lack of a negative charge on the floating gate 316, referred to herein as the "second charge state," can be associated with either a logic "0" or "1" and that the invention is not limited to any particular association between the second charge state and a particular logic value. The one requirement is that the program, erase and sensing circuitry used to access the nonvolatile portion of the cell 300 associate the second charge state to the same logic value and that the logic value be different than the value chosen for the first charge state.

Figure 4:
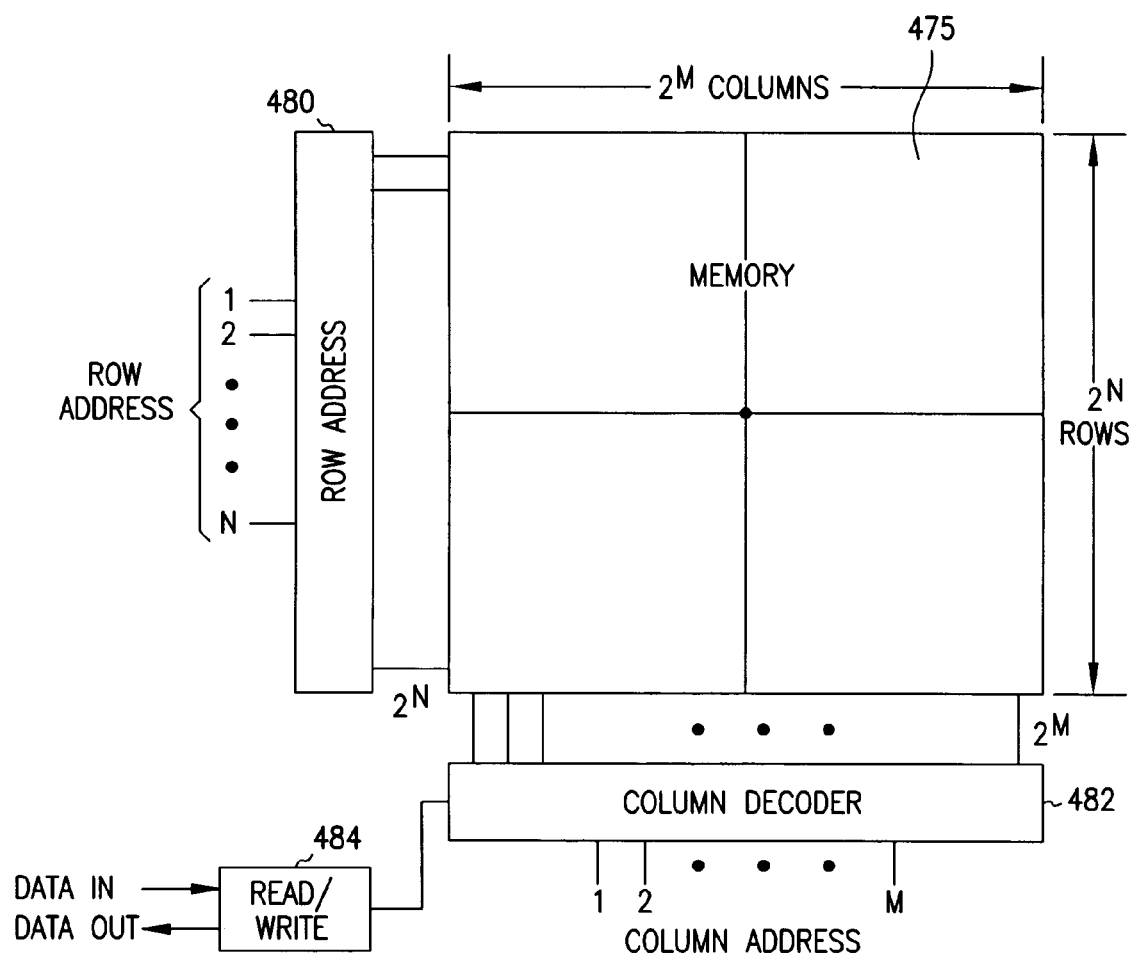
FIG. 4 is a block diagram of a memory device such as can include DRAM cells constructed in accordance with the embodiments of the present invention.

FIG. 4 is a block diagram of a memory device such as can include DRAM cells constructed in accordance with the embodiments of the present invention. According to the teachings of the present invention, memory cells 300 of either embodiment shown in FIGS. 3A and 3B are embedded in an array of similar cells as shown in FIG. 4. A typical memory array consists of a matrix of storage bits with bit capacity $2^N \times 2^M$ bits arranged in an array 475 with $2^M$ columns (bit lines) and $2^N$ rows (word lines).

To read data stored in the array 475, a row address is input and decoded by row decoder 480 to select one of the rows or word lines. All of the cells along this word line are activated. Column decoder 482 then addresses one bit out of the $2^M$ bits that have been activated and routes the data that is stored in that bit to a sense amplifier (not shown) and then out of the array 475. Data in and Data out are controlled by the Read/Write Control circuit 484.

Figure 5:
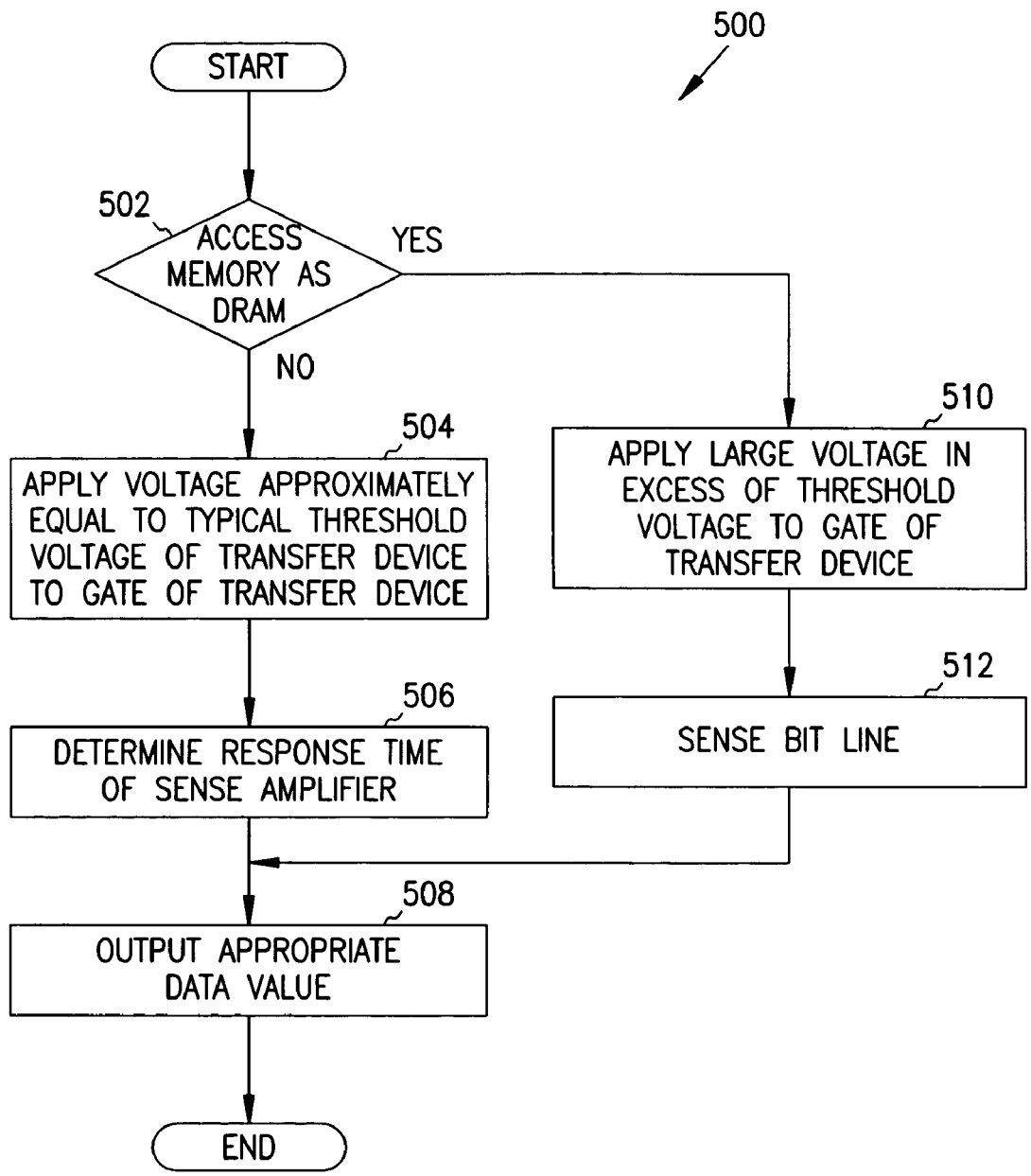
FIG. 5 illustrates an exemplary process for sensing the state of the nonvolatile memory component of the DRAM cells illustrated in FIGS. 3A and 3B.

FIG. 5 is a flow chart illustrate the manner in which information is read/sensed from a DRAM cell having repressed memory according to the teachings of the present invention. Initially it must be determined whether the DRAM cell with repressed memory is being accessed as a DRAM or as a nonvolatile memory. This is shown in FIG. 5 as decision step 502. If the DRAM cell having repressed memory is to be operated as a DRAM, a voltage in excess of the normal threshold voltage of the cell's transfer device is applied to the control gate of the cell, 510. A charge on the floating gate may effect the characteristics (e.g., resistance) of the transfer device and its threshold voltage. A difference in threshold voltage of the transfer device will have no effect on the potential transferred to the bit line, but it will effect the rate at which it is transferred. The difference in threshold voltage and resistance of the transfer device determines only the current, but the DRAM sense amplifiers respond only to potential differences.

Small differences in threshold voltage may alter the response time of the sense amplifier, but not the final potential difference sensed, which is the determinant factor in a DRAM. It is desirable for the word line to be driven to a voltage as far as possible in excess of the threshold voltage of the transfer device to minimize the resistance of the transfer device (typically a few thousand ohms). This results in the charge stored in the capacitor being transferred to the bit line in a sub-nanosecond time period. The sense amplifier subsequently responds with either a sensed $V_{out}^+$ or a $V_{out}^-$, depending upon the charge stored in the capacitor, after time $t_S$ whether or not the floating gate is in the first charge state, 512. Once the sense amplifier has sensed the potential on the bit line, the appropriate data value may be output, 508.

If the nonvolatile portion of the cell is to be accessed, a voltage that is approximately equal to the typical threshold voltage of the cell transfer device is applied to the control gate of the cell, 504. This will cause the charge stored on the capacitor to be transferred to the bit line. This charge is not being used for its data value since it represents the stored DRAM value. Instead, as will be described below, the charge is being used to determine the response time of the sense amplifier, since the response time is indicative of whether the transfer device is programmed to the first or second charge state, 506.

As noted earlier, a charge on the floating gate may effect the characteristics, e.g. resistance, of the transfer device and its threshold voltage. The characteristics will vary depending upon the threshold voltage. For example, if the threshold voltage is high, e.g. 0.6 volts, the transfer device has a higher resistance and it will not conduct well. This would represent the case when electrons are stored on the floating gate. That is, the floating gate is programmed to the first charge state. Likewise, if the threshold voltage is low, e.g. 0.0 volts, the transfer device has a low resistance and it will conduct much better. This would represent the case when electrons are not stored on the floating gate. That is, the floating gate is programmed to the second charge state.

Thus, applying a voltage of about 1 volt, for example, the resistance of the transfer device can be sensed. The resistance will determine the response time of the sense amplifier.

Figure 6A:
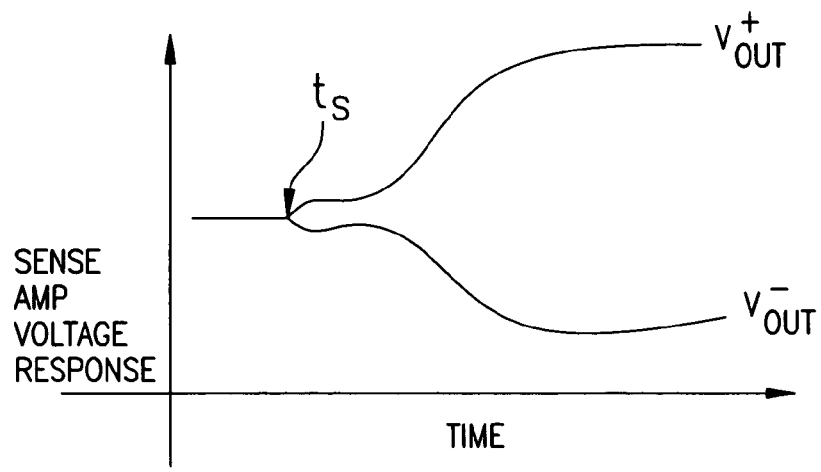
FIGS. 6A and 6B illustrate a sense amplifier voltage response over time associated with the sensing of the contents of the DRAM cells illustrated in FIGS. 3A and 3B.

FIG. 6A is a graph of the sense amp voltage response versus time for the DRAM cell having repressed memory, according to the teachings of the present invention, when the non-volatile memory portion of the cell, is in an unprogrammed state. That is, the floating gate is programmed to the second charge state. If the transfer device has a low resistance because it has been programmed with the second charge state, the stored charge from the storage capacitor (whose value is not important) is transferred to the bit line at approximately the same speed as the transfer of the charge described in steps 510 and 512, e.g. DRAM operation. The sense amplifier subsequently responds with, for example, a sensed Vout⁻ after time $t_S$ as shown in FIG. 6A. It should be appreciated that the second charge state can be associated with a sensed Vout⁺ instead of the Vout⁻.

Figure 6B:
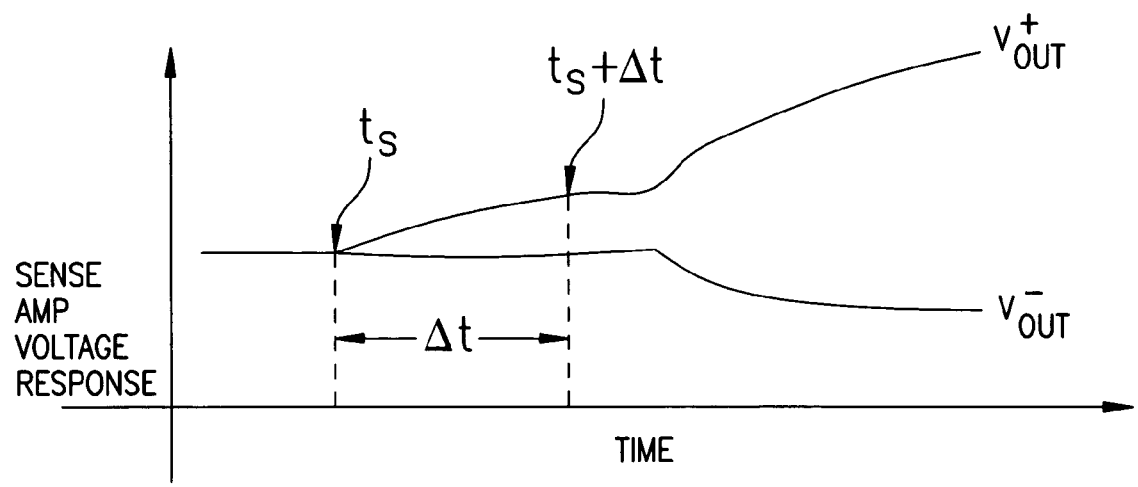

FIG. 6B is a graph of the sense amp voltage response versus time for the DRAM cell having repressed memory, according to the teachings of the present invention, when the non-volatile memory portion of the cell is in a programmed state. That is, the floating gate is programmed to the first charge state having electrons stored thereon. If the transfer device has a high resistance because it has been programmed to the first charge state the stored charge from the storage capacitor, whose value is not important, is transferred to the bit line much slower in comparison to the transfer of the charge described in steps 510 and 512, e.g. DRAM operation. As shown in FIG. 6B, when a stored charge is present on the floating gate (first charge state) the sense amplifier subsequently responds with, for example, a sensed Vout⁺ after time $t_S+\Delta t$. It should be appreciated that the first charge state can be associated with a sensed Vout⁻ instead of the Vout⁺.

Once the response time of the sense amplifier in developing the appropriate potential, Vout⁺ or Vout⁻ has been determined, the appropriate data value may be output, 508.

As discussed above in connection with FIGS. 3A and 3B, the DRAM cell 300 of the present invention can be operated as a DRAM and a nonvolatile memory and is suitable for use in many applications and systems that require both DRAM and nonvolatile memory. Examples include a fault tolerant system, start-up conditions, the saving and/or restoring of the state of a central processing unit (CPU) that is executing software instructions in a protected mode of operation, and shadow memory applications. The cell 300 can be used in an array such as the array 242 within the DRAM device 240 illustrated in FIG. 2 or it can be used as a separate special purpose memory if so desired. Moreover, a DRAM device such as the device 240 illustrated in FIG. 2 can contain an array 242 having conventional DRAM cells and DRAM cells with repressed memory constructed in accordance with the present invention.

The decision when to access the cell 300 as a DRAM and when to access it as a nonvolatile memory is application specific. For example, data can be written into the DRAM portion of the cell 300 and copied to the nonvolatile portion. Similarly, data can be written into the nonvolatile portion and then copied in to the DRAM portion. It is also possible to operate the DRAM and nonvolatile portions independently of each other. Any of these methods can be used and the invention is not to be limited to any particular method of using the DRAM and nonvolatile portions of the cell 300.

Figure 7A:
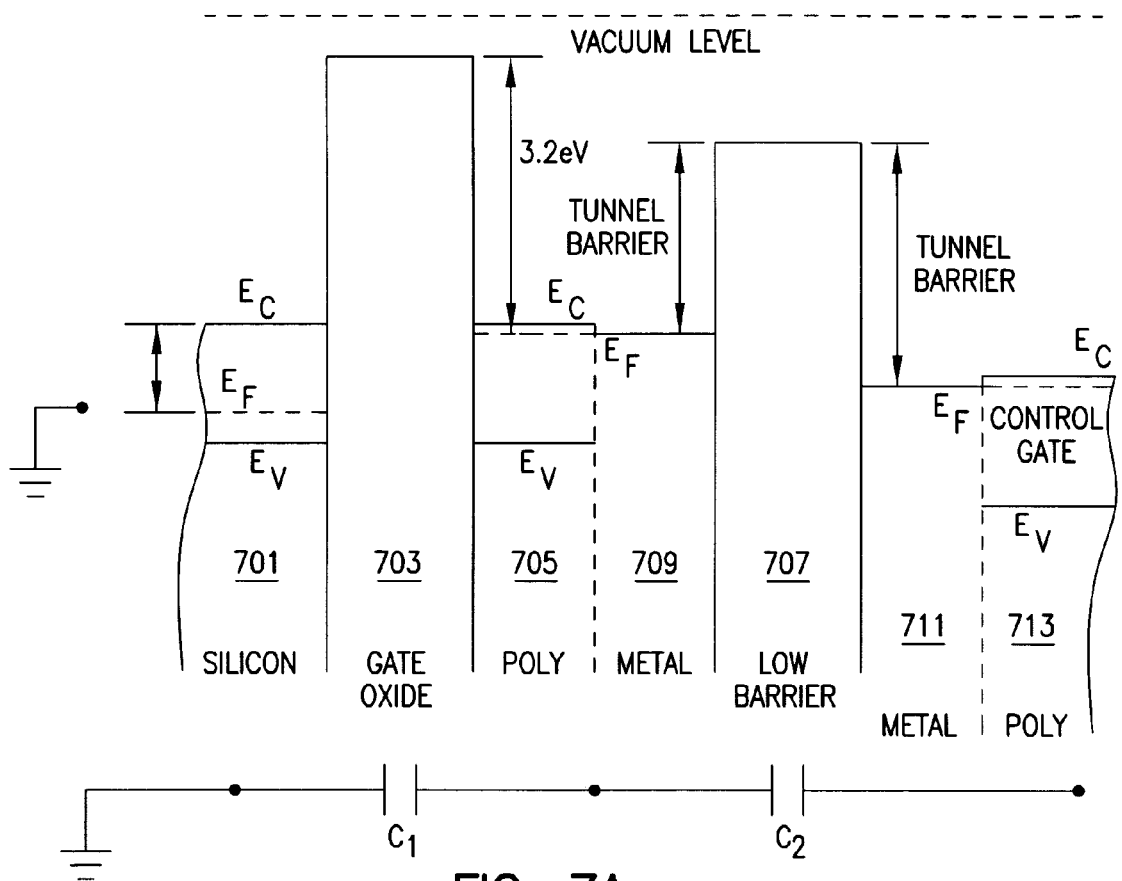
FIG. 7A is an energy band diagram illustrating the band structure at vacuum level with the low tunnel barrier interpoly insulator according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
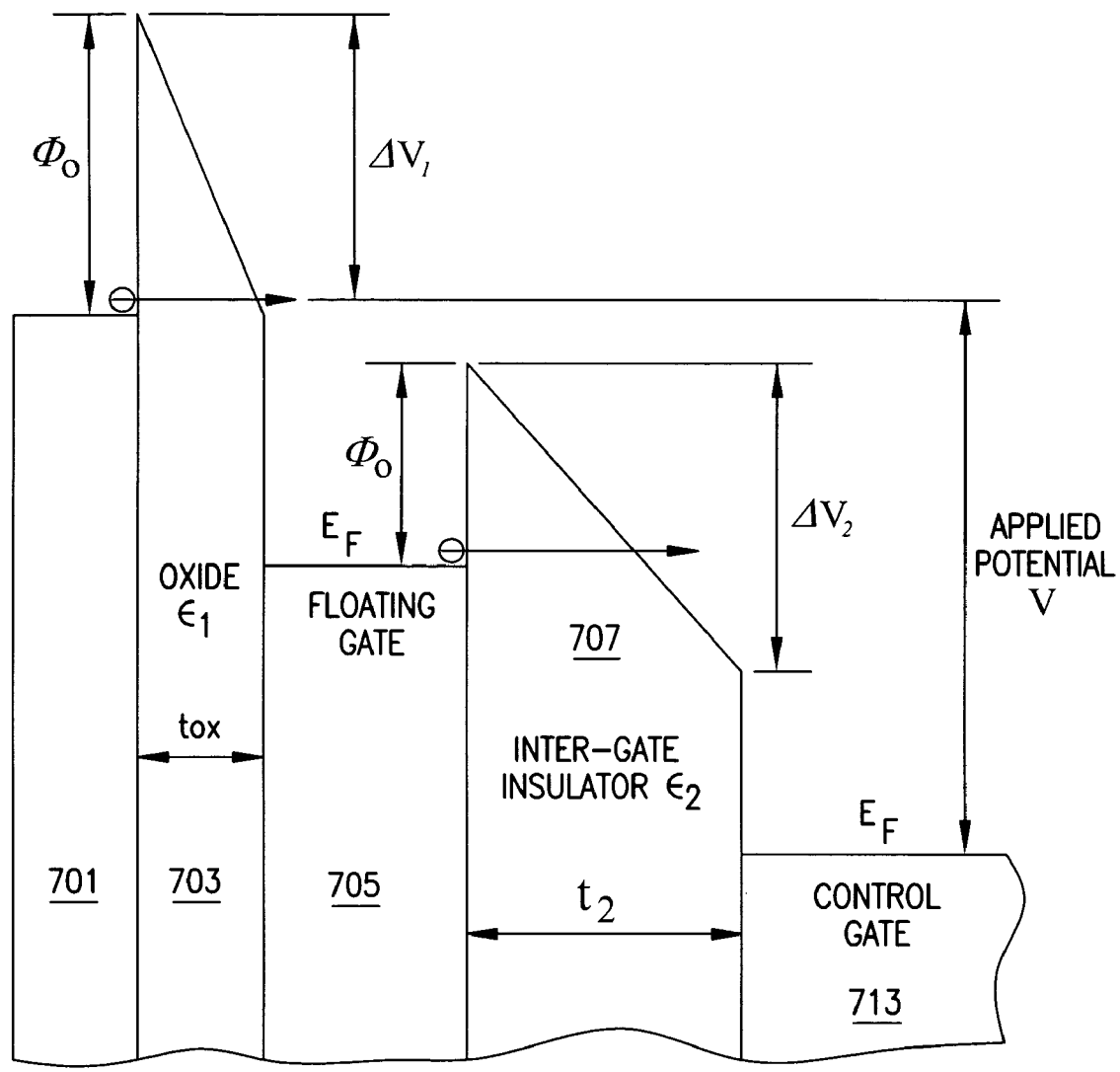
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure in the non-volatile memory component according to the teachings of the present invention.

As shown in FIG. 7B, the electric field is determined by the total voltage difference across the structure, the ratio of the capacitances (see FIG. 7A), and the 20 thickness of the interpoly dielectric 707. The voltage across the interpoly dielectric 707 will be, $\Delta V2 = V\, C1/(C1+C2)$, where V is the total applied voltage. The capacitances, C, of the structures depends on the dielectric constant, $\in_r$, the permittivity of free space, $\in_o$, and the thickness of the insulating layers, t, and area, A, such that $C = \in_r \in_o A/t$, Farads/cm². The electric field across the interpoly dielectric insulator 707, having capacitance, C2, will then be $E2 = \Delta V2/t2$, where t2 is the thickness of this layer.

The tunneling current in erasing charge from the floating gate 705 by tunneling to the control gate 713 will then be as shown in FIG. 7B given by an equation of the form:

$$J = B\, \exp(-Eo/E)$$

$$J = (q^2 E^2 / 4\pi h \Phi_0)\exp(-Eo/E)$$

$$Eo = (8\pi/3h)(2m^*q)^{1/2} h \Phi_0^{3/2}$$

where E is the electric field across the interpoly dielectric insulator 707 and Eo depends on the barrier height, $\Phi_0$.

Practical values of current densities for aluminum oxide which has a current density of 1 A/cm² at a field of about $E=1V/20A=5\times10^{+6}$ V/cm are evidenced in a description by Pollack. Practical current densities for silicon oxide transistor gate insulators which has a current density of 1 A/cm² at a field of about $E=2.3V/23A=1\times10^{+7}$ V/cm are evidenced in a description by T. P. Ma et al.

The lower electric field in the aluminum oxide interpoly insulator 707 for the same current density reflects the lower tunneling barrier of less than 2 eV, shown in FIG. 7B, as opposed to the 3.2 eV tunneling barrier of silicon oxide 703, also illustrated in FIG. 7B.

Figure 7C:
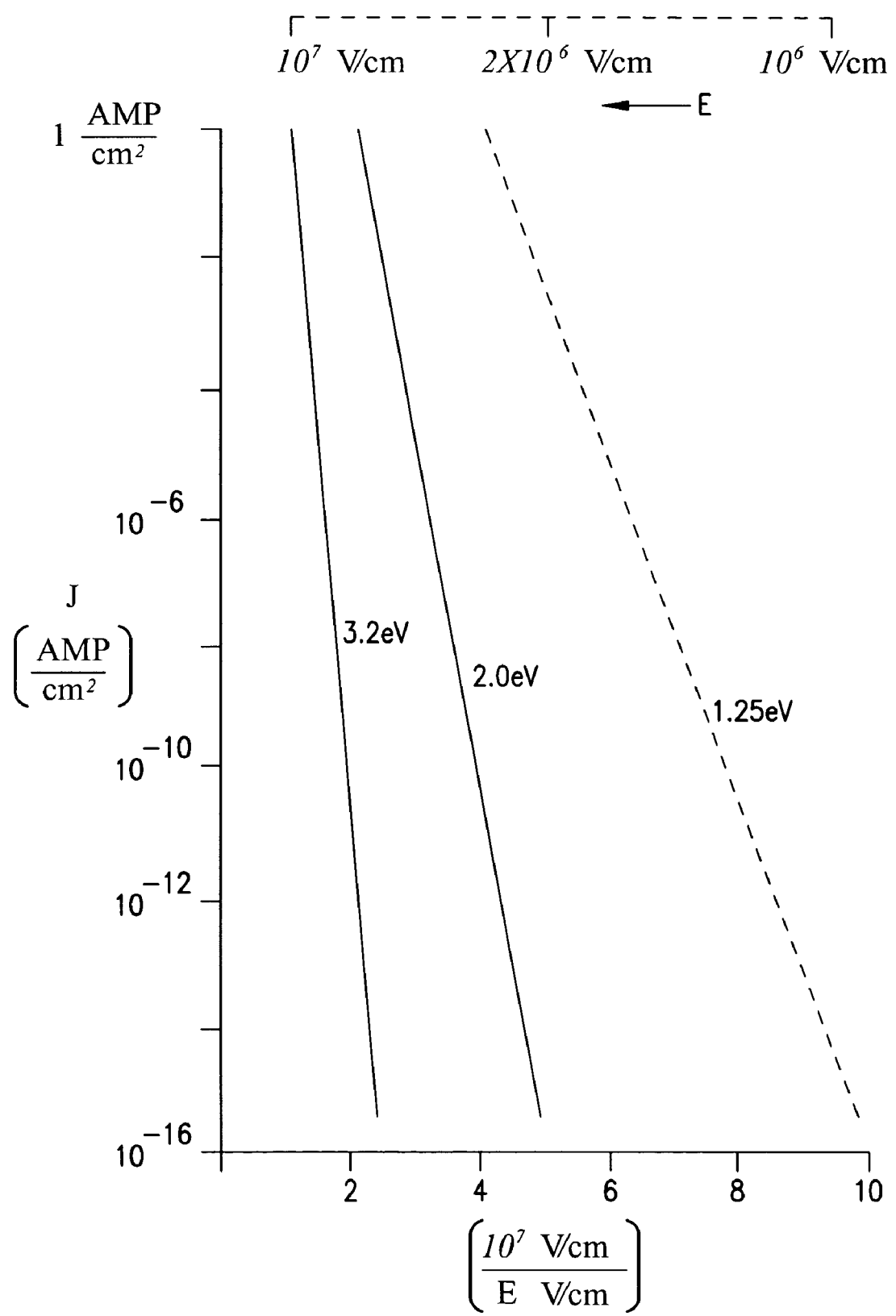
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for a number of barrier heights. FIG. 7C illustrates the dependence of the tunneling currents in the non-volatile memory component on electric field (reciprocal applied electric field) and barrier height. The fraction of voltage across the interpoly or intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the control gate structure described above in connection with FIG. 3B.

Methods of Formation

Several examples are outlined below in order to illustrate how a diversity of such metal oxide tunnel barriers can be formed for the non-volatile memory component, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native $SiO_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native $SiO_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

Figure 2:
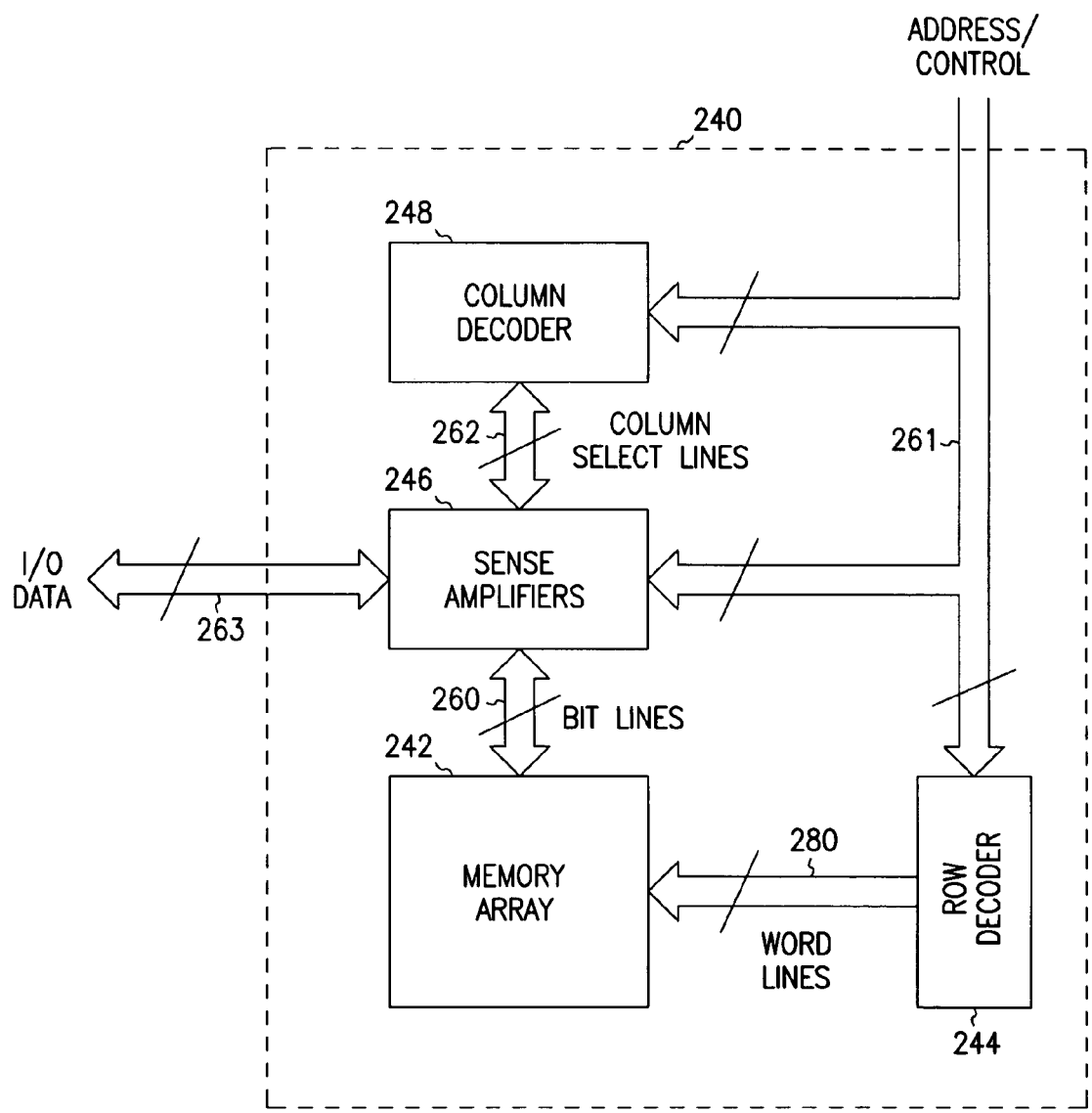
FIG. 2 is a block diagram illustrating a DRAM device.

(iv) Modifications in the structure shown in FIG. 2 may be introduced in order to compensate for certain properties in some metal/oxide/metal layers. Such changes are reasonable since a wide range of metals, alloys and oxides with quite different physical and chemical properties can be used to form these tunnel junctions.

EXAMPLE I

Formation of PbO Tunnel Barriers

This oxide barrier has been studied in detail using Pb/PbO/Pb structures. The oxide itself can be grown very controllably on deposited lead films using either thermal oxidation or rf sputter etching in an oxygen plasma. It will be seen that there are a number of possible variations on this structure. Starting with a clean poly-Si substrate, one processing sequence using thermal oxidation involves:

(i) Depositing a clean lead film on the poly-Si floating gate at ~25 to 75 C in a clean vacuum system having a base pressure of $\sim 10^{-8}$ Torr or lower. The Pb film will be very thin with a thickness within 1 or 2 A of its target value.

(ii) Lead and other metal films can be deposited by various means including physical sputtering and/or from a Knudsen evaporation cell. The sputtering process also offers the ability to produce smoother films by increasing the re-sputtering-to-deposition ratio since re-sputtering preferentially reduces geometric high points of the film.

(iii) Using a "low temperature oxidation process" to grow an oxide film of self-limited thickness. In this case, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 A, as determined via in situ ellipsometric or ex situ measurements of Josephson tunneling currents. This control is demonstrated by the very limited statistical scatter of the current PbO thickness data shown in the insert of FIG. 3 in the article by J. M. Eldridge and J. Matisoo, entitled "Measurement of tunnel current density in a Meal-Oxide-Metal system as a function of oxide thickness." This remarkable degree of control over tunnel current is due to the excellent control over PbO thickness that can be achieved by "low temperature oxidation." For example, increasing the oxidation time from 100 to 1,000 minutes at an oxygen pressure of 750 Torr at 25 C only raises the PbO thickness by 3 A. Accordingly, controlling the oxidation time to within 1 out of a nominal 100 minute total oxidation time provides a thickness that is within 0.1 A of 21 A. The PbO has a highly stoichiometric composition throughout its thickness, as evidenced from ellipsometry and the fact that the tunnel barrier heights are identical for Pb/PbO/Pb structures.

(iv) Re-evacuate the system and deposit the top lead electrode. This produces a tunnel structure having virtually identical tunnel barriers at both Pb/O interfaces.

(v) The temperature used to subsequently deposit the Poly-Si control gate must be held below the melting temperature (327 C) of lead. The PbO itself is stable (up to ~500 C or higher) and thus introduces no temperature constraint on subsequent processes. One may optionally oxidize the lead film to completion, thereby circumventing the low melting temperature of metallic lead. In this case, one would form a Poly-Si/PbO/Poly-Si tunnel structure having an altered tunnel barrier for charge injection. Yet another variation out of several would involve: oxidizing the lead film to completion; replacing the top lead electrode with a higher melting metal such as Al; and, then adding the poly-Si control layer. This junction would have asymmetrical tunneling behavior due to the difference in barrier heights between the Pb/PbO and PbO/Al electrodes.

EXAMPLE II

Formation of $Al_2O_3$ Tunnel Barriers

A number of studies have dealt with electron tunneling in $Al/Al_2O_3/Al$ structures where the oxide was grown by "low temperature oxidation" in either molecular or plasma oxygen. Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from $Al/Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model. In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, we can proceed to outline one process path out of several that can be used to form $Al_2O_3$ tunnel barriers. Here the aluminum is thermally oxidized although one could use other techniques such as plasma oxidation or rf sputtering in an oxygen plasma. For the sake of brevity, some details noted above will not be repeated. The formation of the $Al/Al_2O_3/Al$ structures will be seen to be simpler than that described for the Pb/PbO/Pb junctions owing to the much higher melting point of aluminum, relative to lead.

(i) Sputter deposit aluminum on poly-Si at a temperature of ~25 to 150 C. Due to thermodynamic forces, the microcrystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. As with PbO, the thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 A by using appropriate oxidation parametrics. The oxide will be amorphous and remain so until temperatures in excess of 400 C are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second layer of aluminum.

(iv) Deposit the Poly-Si control gate layer using conventional processes.

EXAMPLE III

Formation of Single- and Multi-Layer Transition Metal Oxide Tunnel Barriers

Single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades with numerous descriptions and references. In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma. Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers.

A new approach was described in a copending application by J. M. Eldridge, entitled "Thin Dielectric Films for DRAM Storage Capacitors," patent application Ser. No. 09/651,380 filed Aug. 29, 2000 that utilizes "low temperature oxidation" to form duplex layers of TM oxides. Unlike MOCVD films, the oxides are very pure and stoichiometric as formed. They do require at least a brief high temperature (est. 700 to 800 C but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner metal oxide tunnel films for the flash memory devices described in this disclosure. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by one J. M. Eldridge of the present authors and are well known to practitioners of the art. It is worth mentioning that highly reproducible TM oxide tunnel barriers can be grown by rf sputtering in an oxygen ambient. Control over oxide thickness and other properties in these studies were all the more remarkable in view of the fact that the oxides were typically grown on thick (e.g., 5,000 A) metals such as Nb and Ta. In such metal-oxide systems, a range of layers and suboxides can also form, each having their own properties. In the present disclosure, control over the properties of the various TM oxides will be even better since we employ very limited (perhaps 10 to 100 A or so) thicknesses of metal and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, so there is no need to repeat them here. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:

(i) Insert certain metals at the TM/poly-Si boundaries that will prevent inter-diffusion of the TM and the poly-Si.

(ii) Completely oxide the TMs. The electrical characteristics of the resulting poly-Si/TM oxide 1/TM oxide 2/poly-Si structure will be different in the absence of having TM at the oxide/metal interfaces.

EXAMPLE IV

Formation of Alternate Metal Compound Tunnel Barriers

Although no applications may be immediately obvious, it is conceivable that one might want to form a stack of oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

EXAMPLE V

Formation of Perovskite Oxide Tunnel Barriers

Some results have been obtained which demonstrate that at least a limited range of high temperature, super-conducting oxide films can be made by thermally oxidizing Y—Ba—Cu alloy films. The present inventors have also disclosed how to employ "low temperature oxidation" and short thermal treatments in an inert ambient at 700 C in order to form a range of perovskite oxide films from parent alloy films (see generally, J. M. Eldridge, "Low Cost Processes for Producing High Quality Perovskite Dielectric Films," application Ser. No. 09/945,137. The dielectric constants of crystallized, perovskite oxides can be very large, with values in the 100 to 1000 or more range. The basic process is more complicated than that needed to oxidize layered films of transition metals. (See Example III.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. of their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Methods of Operation

Write Operation

Write can be achieved by the normal channel hot electron injection and gate current through the silicon oxide to the floating gate. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates, electrons will tunnel from the control gate to the floating gate. The low tunnel barrier provided by the inter-gate insulator will provide an easy write operation and the selection of the substrate or well bias will provide selectivity and address only one device.

Erase Operation

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read Operation

To read the non-volatile memory function a column line is addressed by applying a positive control gate voltage and the current sensed along the data bit or drain row address line. Different currents will result in different read times.

System Level

Figure 8:
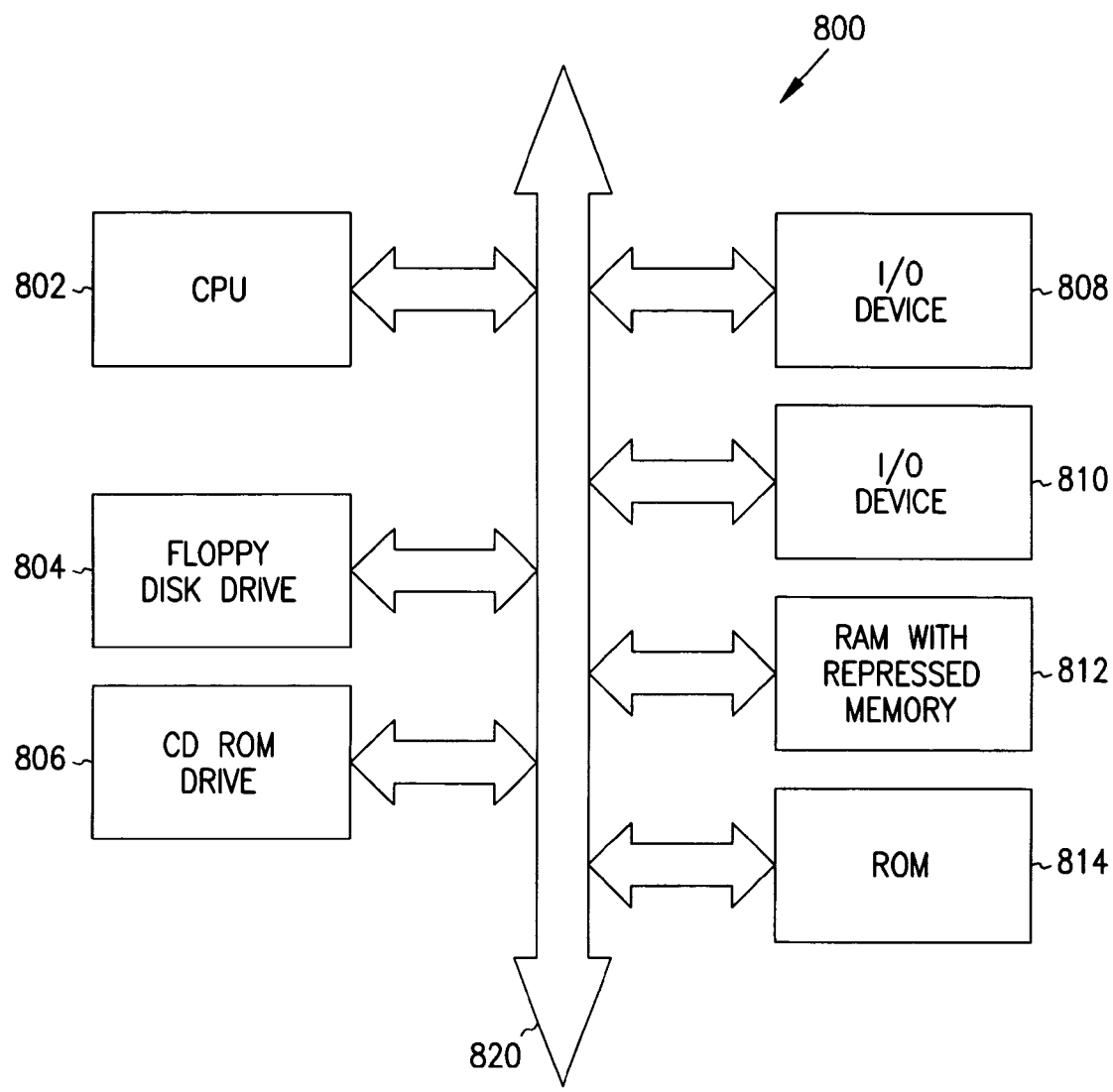
FIG. 8 illustrates a block diagram of a computer system utilizing the DRAM cells illustrated in FIGS. 3A and 3B.

FIG. 8 is a block diagram of a processor-based system 800 utilizing RAM with repressed memory 812 constructed in accordance with the present invention. That is, the RAM 812 utilizes the DRAM cell 100 illustrated in FIG. 3A or 3B. The processor-based system 800 may be a computer system, a process control system or any other system employing a processor and associated memory. The system 800 includes a central processing unit (CPU) 802, e.g., a microprocessor, that communicates with the RAM 812 and an I/O device 808 over a bus 820. It must be noted that the bus 820 may be a series of buses and bridges commonly used in a processor-based system, but for convenience purposes only, the bus 820 has been illustrated as a single bus. A second I/O device 810 is illustrated, but is not necessary to practice the invention. The processor-based system 800 also includes read-only memory (ROM) 814 and may include peripheral devices such as a floppy disk drive 804 and a compact disk (CD) ROM drive 806 that also communicates with the CPU 802 over the bus 820 as is well known in the art.

It should be noted that the repressed memory state stored on the floating gate can be determined as a separate operation by measuring independently the threshold voltage of the transfer devices. The storage capacitor can first be fully charged and then the current supplied by the transfer device is measured at many different gate voltages. A linear regression can be used to determine the threshold voltage or repressed memory state stored. This operation will take a relatively longer time than the operation as a normal DRAM or SRAM.

It should be noted that structures other than the floating polysilicon gate, or different materials for the floating gate, may be used to trap electrons where charging is performed by tunneling of the electrons to and from the silicon. For instance, composite insulators can be employed in the MIOS devices that introduce trapping states between the insulators as in MNOS devices that have been used in nonvolatile memories.

It will be appreciated by those skilled in the art that additional circuitry and control signals can be provided, and that the system 800 has been simplified to help focus on the invention. At least one of the memory cells of the RAM with repressed memory 812 has a memory cell formed according to the embodiments of the present invention. That is, at least one memory cell includes a low tunnel barrier interpoly insulator according to the teachings of the present invention.

It will be understood that the embodiment shown in FIG. 8 illustrates an embodiment for electronic system circuitry in which the novel memory cells of the present invention are used. The illustration of system 800, as shown in FIG. 8, is intended to provide a general understanding of one application for the structure and circuitry of the present invention, and is not intended to serve as a complete description of all the elements and features of an electronic system using the novel memory cell structures. Further, the invention is equally applicable to any size and type of RAM with repressed memory 812 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The above structures and fabrication methods have been described, by way of example, and not by way of limitation, with respect to memory having both a volatile and a non-volatile component in a single memory cell. The non-volatile component includes a floating gate separated from a control gate by a low tunnel barrier interpoly insulators ultra thin body transistors. This is not like having two separate storage devices connected to the same bit or data line. Here, instead, the two different memory functions, DRAM and NVRAM, are performed by the same and single device.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interploy dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

What is claimed is:

1. A memory comprising: a memory cell, the memory cell including
   a source region and a drain region separated by a channel region in a substrate;
   a storage capacitor coupled to one of the source and drain regions;
   a floating gate opposing the channel region;
   a gate oxide separating the floating gate from the channel region, the gate oxide having a first tunneling barrier height;
   a control gate opposing the floating gate; and
   a metal oxide insulator separating the control gate from the floating gate, the metal oxide insulator having a second tunneling barrier height, the second tunneling barrier height being less than the first tunneling barrier height, wherein the memory is adapted to operate the memory cell in a volatile memory mode and in a non-volatile memory mode.

2. The memory of claim 1, wherein the floating gate includes a polysilicon floating gate having a metal layer separating the polysilicon floating gate and the metal oxide insulator, the metal layer in contact with the metal oxide insulator.

3. The memory of claim 1, wherein the control gate includes a polysilicon control gate having a metal layer separating the polysilicon control gate and the metal oxide insulator, the metal layer in contact with the metal oxide insulator.

4. The memory of claim 1, wherein the gate oxide includes silicon dioxide having a tunnel barrier height of about 3.2 eV.

5. The memory of claim 1, wherein the metal oxide insulator includes a transition metal oxide.

6. The memory of claim 1, wherein the metal oxide insulator includes aluminum oxide.

7. The memory of claim 1, wherein the metal oxide insulator includes lead oxide.

8. The memory of claim 1, wherein the metal oxide insulator includes zirconium oxide.

9. The memory of claim 1, wherein the metal oxide insulator includes titanium oxide.

10. The memory of claim 1, wherein the metal oxide insulator includes a Perovskite metal oxide insulator.

11. The memory of claim 1, wherein the channel region includes an n-type channel.

12. A memory comprising: a memory cell, the memory cell including
a source region and a drain region separated by a channel region in a substrate;
a storage capacitor coupled to the drain region;
a floating gate opposing the channel region;
a gate oxide separating the floating gate from the channel region, the gate oxide having a first tunneling barrier height;
a control gate opposing the floating gate;
a metal oxide insulator separating the control gate from the floating gate, the metal oxide insulator having a second tunneling barrier height, the second tunneling barrier height being less than the first tunneling barrier height;
a first metal layer separating the metal oxide insulator and the floating gate, the first metal layer in contact with the floating gate;
a second metal layer separating the metal oxide insulator and the control gate, the metal layer in contact with the control gate, wherein the memory is adapted to operate the memory cell in a volatile memory mode and in a non-volatile memory mode.

13. The memory of claim 12, wherein the control gate is a vertical control gate.

14. The memory of claim 13, wherein the control gate is a polysilicon edge defined vertical control gate.

15. The memory of claim 12, wherein the memory cell is controllable to access a first charge representing a data value from the storage capacitor in the volatile memory mode and a second charge representing a data value from the floating gate in the non-volatile memory mode such that the first charge is accessible without affecting the second charge and the second charge is accessible without affecting the first charge.

16. The memory of claim 12, wherein the metal oxide insulator includes a transition metal oxide.

17. The memory of claim 12, wherein the metal oxide insulator includes aluminum oxide.

18. The memory of claim 12, wherein the metal oxide insulator includes niobium oxide.

19. The memory of claim 12, wherein the metal oxide insulator includes tantalum oxide.

20. The memory of claim 12, wherein the floating gate includes a horizontally oriented floating gate in contact with the gate oxide.

21. The memory of claim 12, wherein the gate oxide includes silicon oxide having a tunneling barrier height of about 3.2 eV, the floating gate includes polysilicon, and the control gate includes polysilicon.

22. A memory comprising:
an array of memory cells, each memory cell including:
a source region and a drain region separated by a channel region in a substrate;
a storage capacitor coupled to the drain region;
a floating gate opposing the channel region;
a gate oxide separating the floating gate from the channel region, the gate oxide including silicon oxide having a tunneling barrier height of about 3.2 eV;
a control gate opposing the floating gate; and
a metal oxide insulator separating the control gate from the floating gate, the metal oxide insulator having a tunneling barrier height less than the tunneling barrier height of the silicon oxide;
a number of bit lines coupled to the source regions along a first direction in the array of memory cells; and
a number of word lines coupled to the control gates along a second direction in the array of memory cells, wherein the memory is adapted to operate each memory cell in the array of memory cells in a volatile memory mode and in a non-volatile memory mode.

23. The memory of claim 22, wherein each memory cell is controllable to access a first charge representing a data value from the storage capacitor in the volatile memory mode and a second charge representing a data value from the floating gate in the non-volatile memory mode such that the first charge is accessible without affecting the second charge and the second charge is accessible without affecting the first charge.

24. The memory of claim 22, wherein each memory cell further includes a first metal layer separating the floating gate and the metal oxide insulator, the first metal layer in contact with the metal oxide insulator, and a second metal layer separating the control gate and the metal oxide insulator, the second metal layer in contact with the metal oxide insulator.

25. The memory of claim 24, wherein the floating gate includes polysilicon, the first metal layer contacting the floating gate, and the control gate includes polysilicon, the second metal layer contacting the control gate.

26. The memory of claim 25, wherein the metal oxide insulator includes a metal oxide insulator having a tunneling barrier height of less than 2 eV.

27. The memory of claim 26, wherein the control gate is a polysilicon edge defined vertical control gate.

28. The memory of claim 25, wherein the metal oxide insulator includes a transition metal oxide.

29. The memory of claim 25, wherein the metal oxide insulator includes aluminum oxide.

30. The memory of claim 25, wherein the metal oxide insulator includes lead oxide.

31. The memory of claim 25, wherein the metal oxide insulator includes zirconium oxide.

32. The memory of claim 25, wherein the metal oxide insulator includes niobium oxide.

33. The memory of claim 25, wherein the metal oxide insulator includes tantalum oxide.

34. The memory of claim 25, wherein the metal oxide insulator includes titanium oxide.

35. The memory of claim 25, wherein the metal oxide insulator includes a Perovskite metal oxide insulator.

36. An electronic system comprising:
a processor; and
a memory coupled to the processor, wherein the memory includes an array of memory cells, each memory cell including:
a source region and a drain region separated by a channel region in a substrate;
a storage capacitor coupled to one of the source and drain regions;
a floating gate opposing the channel region;

a gate oxide separating the floating gate from the channel region, the gate oxide having a first tunneling barrier height;

a control gate opposing the floating gate; and a metal oxide insulator separating the control gate from the floating gate, the metal oxide insulator having a second tunneling barrier height, the second tunneling barrier height being less than the first tunneling barrier height, wherein the memory is adapted to operate each memory cell in the array of memory cells in a volatile memory mode and in a non-volatile memory mode.

37. The electronic system of claim 36, wherein each memory cell is controllable to access a first charge representing a data value from the storage capacitor in the volatile memory mode and a second charge representing a data value from the floating gate in the non-volatile memory mode such that the first charge is accessible without affecting the second charge and the second charge is accessible without affecting the first charge.

38. The electronic system of claim 36, wherein the control gate is a vertical control gate.

39. The electronic system of claim 36, wherein the vertical control gate is a polysilicon edge defined vertical control gate.

40. The electronic system of claim 36, wherein the gate oxide includes silicon oxide having a tunneling barrier height of about 3.2 eV.

41. The electronic system of claim 36, wherein the metal oxide insulator includes a transition metal oxide.

42. The electronic system of claim 36, wherein the metal oxide insulator includes aluminum oxide.

43. The electronic system of claim 36, wherein the metal oxide insulator includes lead oxide.

44. The electronic system of claim 36, wherein the metal oxide insulator includes tantalum oxide.

45. The electronic system of claim 36, wherein the metal oxide insulator includes a Perovskite metal oxide insulator.

46. An electronic system comprising:
a processor; and
a memory coupled to the processor, wherein the memory includes:
an array of memory cells, each memory cell including:
a source region and a drain region separated by a channel region in a substrate;
a storage capacitor coupled to one of the drain region;
a floating gate opposing the channel region;
a gate oxide separating the floating gate from the channel region, the gate oxide having a first tunneling barrier height;
a control gate opposing the floating gate;
a metal oxide insulator separating the control gate from the floating gate, the metal oxide insulator having a second tunneling barrier height, the second tunneling barrier height being less than the first tunneling barrier height; and
a first metal layer separating the floating gate and the metal oxide insulator, the first metal layer in contact with the metal oxide insulator;
a number of bit lines coupled to the source regions along a first direction in the array of memory cells; and
a number of word lines coupled to the control gates along a second direction in the array of memory cells, wherein the memory is adapted to operate each memory cell in the array of memory cells in a volatile memory mode and in a non-volatile memory mode.

47. The electronic system of claim 46, wherein each memory cell further includes a second metal layer separating the control gate and the metal oxide insulator, the second metal layer in contact with the metal oxide insulator.

48. The electronic system of claim 47, wherein the floating gate includes polysilicon, the first metal layer contacting the floating gate, and the control gate includes polysilicon, the second metal layer contacting the control gate.

49. The electronic system of claim 48, wherein the gate oxide includes silicon oxide having a tunneling barrier height of about 3.2 eV.

50. The electronic system of claim 49, wherein the metal oxide insulator includes zirconium oxide.

51. The electronic system of claim 48, wherein the metal oxide insulator includes a transition metal oxide.

52. The electronic system of claim 48, wherein the metal oxide insulator includes zirconium oxide.

53. The electronic system of claim 48, wherein the metal oxide insulator includes niobium oxide.

54. The electronic system of claim 48, wherein the metal oxide insulator includes titanium oxide.

55. The electronic system of claim 48, wherein the metal oxide insulator includes a Perovskite metal oxide insulator.

56. A method of forming a memory, comprising:
forming a memory cell including:
forming a source region and a drain region separated by a channel region in a substrate;
forming a storage capacitor coupled to one of the source and drain regions;
forming a gate oxide on the channel region, the gate oxide having a first tunneling barrier height;
forming a floating gate opposing the channel region, the floating gate separated from the channel region by the gate oxide;
forming a control gate opposing the floating gate; and
forming a metal oxide insulator separating the control gate from the floating gate,
the metal oxide insulator having a second tunneling barrier height, the second tunneling barrier height being less than the first tunneling barrier height; and
adapting the memory to operate the memory cell in a volatile memory mode and in a non- volatile memory mode.

57. The method of claim 56, wherein forming a metal oxide insulator includes forming a transition metal oxide insulator.

58. The method of claim 56, wherein forming a metal oxide insulator includes forming aluminum oxide.

59. The method of claim 56, wherein forming a metal oxide insulator includes forming zirconium oxide.

60. The method of claim 56, wherein forming a metal oxide insulator includes forming lead oxide.

61. The method of claim 56, wherein forming a metal oxide insulator includes forming a Perovskite metal oxide insulator.

62. The method of claim 56, wherein forming a floating gate includes forming a polysilicon floating gate having a metal layer formed thereon in contact with the metal oxide insulator.

63. The method of claim 56, wherein forming a control gate includes a forming a polysilicon control gate having a metal layer formed thereon in contact with the metal oxide insulator.

64. The method of claim 56, wherein forming a gate oxide includes forming silicon dioxide having a tunneling barrier height of about 3.2 eV.

65. The method of claim 56, wherein forming a control gate includes forming an edge defined vertical control gate.

66. A method of forming a memory, comprising:
forming an array of memory cells, wherein forming each memory cell includes:
forming a source region and a drain region separated by a channel region in a substrate;
forming a storage capacitor coupled to the drain region;
forming a floating gate opposing the channel region;
forming a gate oxide separating the floating gate from the channel region, the gate oxide having a first tunneling barrier height;
forming a first metal layer separating the metal oxide insulator and the floating gate, the first metal layer in contact with the floating gate;
forming a control gate opposing the floating gate; and
forming a metal oxide insulator separating the control gate from the floating gate, the metal oxide insulator having a second tunneling baffler height, the second tunneling barrier height being less than the first tunneling barrier height;
forming a number of bit lines coupled to the source regions along a first direction in the array of memory cells;
a number of word lines coupled to the control gates along a second direction in the array of memory cells; and
adapting the memory to operate each memory cell in the array of memory cells in a volatile memory mode and in a non-volatile memory mode.

67. The method of claim 66, wherein adapting the memory to operate each memory cell includes adapting the memory to control each memory cell to access a first charge representing a data value from the storage capacitor in the volatile memory mode and a second charge representing a data value from the floating gate in the non-volatile memory mode, wherein the first charge is accessible without affecting the second charge and the second charge is accessible without affecting the first charge.

68. The method of claim 66, wherein the method further includes forming a second metal layer on the control gate, the second metal layer in contact with the metal oxide insulator.

69. The method of claim 68, wherein forming a floating gate includes forming a polysilicon floating gate.

70. The method of claim 69, wherein forming a gate oxide includes forming silicon oxide having a tunneling barrier height of about 3.2 eV.

71. The method of claim 70, wherein forming a metal oxide insulator includes forming a transition metal oxide.

72. The method of claim 70, wherein forming a metal oxide insulator includes forming titanium oxide.

73. The method of claim 70, wherein forming a metal oxide insulator includes forming tantalum oxide.

74. The method of claim 70, wherein forming a metal oxide insulator includes forming niobium oxide.

75. The method of claim 70, wherein forming a metal oxide insulator includes forming a Perovskite metal oxide insulator.

76. The method of claim 70, wherein forming a source region and a drain region includes forming a n+ source region and a n+ drain region.

77. The method of claim 70, wherein forming a control gate includes forming a vertical control gate.

78. The method of claim 70, wherein forming a control gate includes forming an edge defined vertical control gate.

79. A method of forming an electronic system, comprising:
providing a processor; and
coupling the processor to a memory, the memory formed by a method including:
forming a memory cell, the memory cell formed by:
forming a source region and a drain region separated by a channel region in a substrate;
forming a storage capacitor coupled to one of the source and drain regions;
forming a gate oxide on the channel region, the gate oxide having a first tunneling barrier height;
forming a floating gate opposing the channel region, the floating gate separated from the channel region by the gate oxide;
forming a control gate opposing the floating gate; and
forming a metal oxide insulator separating the control gate from the floating gate, the metal oxide insulator having a second tunneling barrier height, the second tunneling barrier height being less than the first tunneling barrier height; and
adapting the memory to operate the memory cell in a volatile memory mode and in a non-volatile memory mode.

80. The method of claim 79, wherein adapting the memory to operate the memory cell includes adapting the memory to control the memory cell to access a first charge representing a data value from the storage capacitor in the volatile memory mode and a second charge representing a data value from the floating gate in the non-volatile memory mode, wherein the first charge is accessible without affecting the second charge and the second charge is accessible without affecting the first charge.

81. The method of claim 79, wherein the method further includes forming a first metal layer on the floating gate, the first metal layer in contact with the metal oxide insulator.

82. The method of claim 81, wherein forming a gate oxide includes forming silicon dioxide having a tunneling barrier height of about 3.2 eV.

83. The method of claim 82, wherein forming a floating oxide includes forming a polysilicon floating gate and forming a control gate includes forming a polysilicon control gate.

84. The method of claim 81, wherein the method further includes forming a second metal layer on the control gate, the second metal layer in contact with the metal oxide insulator.

85. The method of claim 81, wherein forming a metal oxide insulator includes forming a transition metal oxide insulator.

86. The method of claim 81, wherein forming a metal oxide insulator includes forming aluminum oxide.

87. The method of claim 81, wherein forming a metal oxide insulator includes forming zirconium oxide.

88. The method of claim 81, wherein forming a metal oxide insulator includes forming lead oxide.

89. The method of claim 81, wherein forming a metal oxide insulator includes forming a Perovskite metal oxide insulator.

90. A method comprising:
operating a memory adapted to control a memory cell in a volatile memory mode and in a non-volatile memory mode, the memory cell including:

a source region and a drain region separated by a channel region in a substrate;
a storage capacitor coupled to one of the source and drain regions;
a floating gate opposing the channel region;
a gate oxide separating the floating gate from the channel region, the gate oxide having a first tunneling barrier height;
a control gate opposing the floating gate; and
a metal oxide insulator separating the control gate from the floating gate, the metal oxide insulator having a second tunneling barrier height, the second tunneling barrier height being less than the first tunneling barrier height;
sensing a first charge representing a data value from the storage capacitor if the memory operates the memory cell in the volatile memory mode; and
sensing a second charge representing a data value from the floating gate if the memory operates the memory cell in the volatile memory mode.

91. The method of claim 90, wherein the method further includes writing to the floating gate using channel hot electron injection.

92. The method of claim 91, wherein writing to the floating gate using channel hot electron injection includes:
applying a large voltage to the control gate; and
applying a large voltage to the drain region.

93. The method of claim 90, wherein the method further includes writing to the floating gate by tunneling electrons from the control gate to the floating gate.

94. The method of claim 93, wherein writing to the floating gate by tunneling electrons from the control gate to the floating gate includes:
applying a positive voltage to the substrate; and
applying a large negative voltage to the control gate.

95. The method of claim 90, wherein the method further includes erasing charge from the floating gate by tunneling electrons from the floating gate to the control gate.

96. The method of claim 95, wherein erasing charge from the floating gate by tunneling electrons from the floating gate to the control gate includes:
providing a negative voltage to the substrate; and
providing a large positive voltage to the control gate.

97. The method of claim 95, wherein tunneling electrons from the floating gate to the control gate includes tunneling electrons from a first metal layer formed on the floating gate through the metal oxide insulator to a second metal layer formed on the control gate, the first metal layer in contact with the metal oxide insulator and the second metal layer in contact with the metal oxide insulator.

98. The method of claim 90, wherein the method further includes reading the memory cell in the non-volatile memory mode by:
applying a positive voltage to the control gate of the memory cell; and
sensing a current from the drain region.

99. The method of claim 90, wherein operating the memory to control the memory cell in the volatile memory mode includes reading charge from the capacitor of the memory cell and/or writing charge from the capacitor of the memory cell.

100. A method comprising:
operating a memory adapted to control a memory cell in a volatile memory mode and in a non-volatile memory mode, the memory cell including:
a source region and a drain region separated by a channel region in a substrate;
a storage capacitor coupled to the drain region;
a polysilicon floating gate opposing the channel region, the polysilicon floating gate having a metal layer disposed thereon;
a silicon oxide layer separating the floating gate from the channel region, the silicon oxide layer having a tunneling barrier height of about 3.2 eV;
a metal oxide insulator, the metal oxide insulator having a tunneling barrier height being less than the tunneling barrier height of the silicon oxide layer, the metal oxide insulator in contact with the metal layer disposed on the polysilicon floating gate; and
a control gate opposing the floating gate and separated from the floating gate by the metal oxide insulator; and
sensing a first charge representing a data value from the storage capacitor if the memory operates the memory cell in the volatile memory mode; and
sensing a second charge representing a data value from the floating gate if the memory operates the memory cell in the volatile memory mode.

101. The method of claim 100, wherein the method further includes writing to the floating gate using channel hot electron injection.

102. The method of claim 101, wherein writing to the floating gate using channel hot electron injection includes:
applying a large voltage to the control gate; and
applying a large voltage to the drain region.

103. The method of claim 100, wherein the method further includes writing to the floating gate by tunneling electrons from the control gate to the floating gate.

104. The method of claim 103, wherein writing to the floating gate by tunneling electrons from the control gate to the floating gate includes:
applying a positive voltage to the substrate; and
applying a large negative voltage to the control gate.

105. The method of claim 100, wherein the method further includes erasing charge from the floating gate by tunneling electrons from the floating gate to the control gate.

106. The method of claim 105, wherein erasing charge from the floating gate by tunneling electrons from the floating gate to the control gate includes:
providing a negative voltage to the substrate; and
providing a large positive voltage to the control gate.

107. The method of claim 105, wherein tunneling electrons from the floating gate to the control gate includes tunneling electrons from the metal layer disposed on the floating gate through the metal oxide insulator to a metal layer disposed on the control gate, the metal layer disposed on the control gate in contact with the metal oxide insulator, the control gate including polysilicon.

108. The method of claim 100, wherein the method further includes reading the memory cell in the non-volatile memory mode by:
applying a positive voltage to the control gate of the memory cell; and
sensing a current from the drain region.

109. The method of claim 100, wherein operating the memory to control the memory cell in the volatile memory mode includes reading charge from the capacitor of the memory cell and/or writing charge from the capacitor of the memory cell.

* * * * *